United States Patent
Cho et al.

(10) Patent No.: US 9,841,617 B2
(45) Date of Patent: Dec. 12, 2017

(54) OPTICAL DEVICE INCLUDING THREE-COUPLED QUANTUM WELL STRUCTURE

(71) Applicant: Samsung Electronics Co., Ltd., Suwon-Si, Gyeonggi-Do (KR)

(72) Inventors: Yongchul Cho, Suwon-si (KR); Yongtak Lee, Gwangju (KR); Byunghoon Na, Suwon-si (KR); Changyoung Park, Yongin-si (KR); Gunwu Ju, Daegu (KR); Yonghwa Park, Yongin-si (KR)

(73) Assignees: Gwangju Institute of Science and Technology, Gwangju (KR); Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 14/492,733

(22) Filed: Sep. 22, 2014

(65) Prior Publication Data
US 2015/0286078 A1 Oct. 8, 2015

(30) Foreign Application Priority Data
Apr. 4, 2014 (KR) ........................ 10-2014-0040746

(51) Int. Cl.
*H01L 31/00* (2006.01)
*H01L 33/00* (2010.01)
(Continued)

(52) U.S. Cl.
CPC .. *G02F 1/01725* (2013.01); *H01L 31/035236* (2013.01); *H01L 31/075* (2013.01);
(Continued)

(58) Field of Classification Search
CPC ....... H01L 2924/00; H01L 2924/00014; H01L 33/62; H01L 33/60; H01L 33/58;
(Continued)

(56) References Cited

U.S. PATENT DOCUMENTS

| 4,525,687 A | 6/1985 | Chemla et al. |
| 5,249,075 A | 9/1993 | Delacourt et al. |

(Continued)

FOREIGN PATENT DOCUMENTS

| JP | 07128622 A1 | 5/1995 |
| JP | 05241208 B2 | 7/2013 |

(Continued)

OTHER PUBLICATIONS

Zhi-Xin Xu et al., "A Novel Coupled Quantum Well Structured with Low-Driving Voltage, Low Absorption Loss and Large Field-Induced Refractive Index Change", Chin.Phys.Lett., 2005, pp. 956-959, vol. 22, No. 4, Chinese Physical Society and IOP Publishing Ltd.

(Continued)

*Primary Examiner* — Evelyn A Lester
(74) *Attorney, Agent, or Firm* — Harness, Dickey & Pierce, P.L.C.

(57) ABSTRACT

An optical device includes an active layer that includes at least two outer barriers and at least one coupled quantum well that is inserted between the at least two outer barriers. Each coupled quantum well includes at least three quantum well layers and at least two coupling barriers that are respectively provided between the at least three quantum well layers. Thicknesses of two quantum well layers disposed at opposite end portions of the at least three quantum well layers are less than a thickness of the other quantum well layer disposed between the two quantum well layers disposed at the opposite end portions. A bandgap of the two (Continued)

quantum well layers disposed at the opposite end portions may be higher than a bandgap of the other quantum well layer disposed between the two quantum well layers.

23 Claims, 16 Drawing Sheets

(51) Int. Cl.

| | |
|---|---|
| *H01L 29/66* | (2006.01) |
| *H01L 29/04* | (2006.01) |
| *H01L 29/40* | (2006.01) |
| *G02F 1/03* | (2006.01) |
| *G02F 1/017* | (2006.01) |
| *H01L 31/0352* | (2006.01) |
| *H01L 31/075* | (2012.01) |
| *H01L 31/105* | (2006.01) |
| *H01L 33/58* | (2010.01) |
| *H01L 23/532* | (2006.01) |
| *H01L 33/10* | (2010.01) |
| *H01L 33/04* | (2010.01) |
| *H01L 33/62* | (2010.01) |
| *H01L 23/528* | (2006.01) |
| *G02F 1/1335* | (2006.01) |
| *H01L 33/46* | (2010.01) |
| *H01L 33/60* | (2010.01) |
| *H01L 33/42* | (2010.01) |
| *H01L 33/50* | (2010.01) |
| *B82Y 20/00* | (2011.01) |
| *G02F 1/015* | (2006.01) |

(52) U.S. Cl.
CPC .......... *H01L 31/105* (2013.01); *B82Y 20/00* (2013.01); *G02F 1/133605* (2013.01); *G02F 2001/0157* (2013.01); *G02F 2001/0175* (2013.01); *G02F 2001/01733* (2013.01); *G02F 2001/01766* (2013.01); *H01L 23/528* (2013.01); *H01L 23/53223* (2013.01); *H01L 31/00* (2013.01); *H01L 33/04* (2013.01); *H01L 33/10* (2013.01); *H01L 33/42* (2013.01); *H01L 33/46* (2013.01); *H01L 33/502* (2013.01); *H01L 33/58* (2013.01); *H01L 33/60* (2013.01); *H01L 33/62* (2013.01); *H01L 2224/05124* (2013.01); *H01L 2924/00* (2013.01); *H01L 2924/00014* (2013.01); *H01L 2924/12042* (2013.01); *Y02E 10/548* (2013.01); *Y10S 977/755* (2013.01)

(58) Field of Classification Search
CPC ..... H01L 33/46; H01L 33/502; H01L 23/528; H01L 33/42; H01L 33/10; H01L 2924/12042; H01L 23/53223; H01L 2224/05124; H01L 31/00; H01L 33/04; G02F 1/133605
USPC .... 257/14, 15, 17, 21, 28, 37, 98, 162, 183, 257/184, 212, 627, 656, 773, E33.068, 257/E33.069, E51.021; 359/263
See application file for complete search history.

(56) References Cited

U.S. PATENT DOCUMENTS

| | | | |
|---|---|---|---|
| 5,286,982 A | 2/1994 | Ackley et al. | |
| 5,416,338 A | 5/1995 | Suzuki et al. | |
| 5,426,512 A | 6/1995 | Watson | |
| 5,521,742 A | 5/1996 | Ishimura | |
| 5,569,934 A | 10/1996 | Fujii et al. | |
| 5,698,863 A | 12/1997 | Pelekanos | |
| 6,100,543 A | 8/2000 | Sakata | |
| 6,154,299 A | 11/2000 | Gilbreath et al. | |
| 6,331,911 B1 | 12/2001 | Manassen et al. | |
| 6,878,562 B2 | 4/2005 | Ooi et al. | |
| 6,956,232 B2 | 10/2005 | Reynolds | |
| 6,978,055 B2 | 12/2005 | Miyazaki | |
| 7,095,542 B2 | 8/2006 | Yu et al. | |
| 7,443,561 B2 | 10/2008 | Bour et al. | |
| 7,795,609 B2 | 9/2010 | Huffaker et al. | |
| 7,800,129 B2 | 9/2010 | Song | |
| 8,179,585 B2 | 5/2012 | Nagase et al. | |
| 9,082,909 B2 | 7/2015 | Cho et al. | |
| 9,190,545 B2 | 11/2015 | Cho et al. | |
| 2013/0170011 A1* | 7/2013 | Cho .......................... G02F 1/03 359/263 |
| 2013/0175500 A1 | 7/2013 | Cho et al. | |

FOREIGN PATENT DOCUMENTS

| | | |
|---|---|---|
| KR | 20120005757 A | 1/2012 |
| KR | 20140089671 A | 7/2014 |
| KR | 20150053156 A | 5/2015 |

OTHER PUBLICATIONS

Jason Thalken et al., "Adaptive design of excitonic absorption in broken-symmetry quantum wells", Applied Physics Letters, Jul. 2004, pp. 121-123, vol. 85, No. 1, American Institute of Physics.
Nacer Debbar et al. "Coupled GaAs/AlGaAs quantum-well electroabsorption modulators for low-electric-field optical modulation", J. Appl. Phys., Jan. 1989, pp. 383-385, American Institute of Physics.
K. W. Goossen et al., "Defect-Free Modulator At 1•06 μm Using a Strain-Balanced Multiquantum Well", Sep. 1992, pp. 1833-1834, Electronics Letters.
M. N. Islam et al., "Electroabsorption in GaAs/AlGaAs coupled quantum well waveguides", Appl. Phys. Lett., Apr. 1987, pp. 1098-1100, vol. 50, No. 16, American Institute of Physics.
Hao Feng et al., "Field-Induced Optical Effect in a Five-Step Asymmetric Coupled Quantum Well with Modified Potential", Jul. 1998, pp. 1197-1208, vol. 34, No. 7, IEEE Journal of Quantum Electronics.
S. Cheung et al., "High contrast Fabry-Perot optical modulator using quantum confined Stark effect tuning in InGaAs—GaAs multiple quantum well cavity", Appl. Phys. Lett., Jul. 1993, pp. 296-298, vol. 63, No. 3, American Institute of Physics.
W. K. Chan et al., "High-Performance Optical Modulators Based on Stepped Quantum Wells", Quantum Sensing and Nanophotonic Devices III, 2006, pp. 1-11, vol. 6127, Proc. of SPIE.
Kambiz Abedi, "Improvemnet of Saturation Optical Intensity in Electroabsorption Modulators with Asymmetric Intra-step-barrier Coupled Double Strained Quantum Wells", Apr. 2011, pp. 83-89, vol. 2, No. 4, Canadian Journal on Electrical and Electronics Engineering.
Keith W, Goossen et al., "Independence of Absorption Coefficient-Linewidth Product to Material System for Multiple Quantum Wells with Excitons from 850 nm to 1064 nm", Dec. 1993, pp. 1392-1394, vol. 5, No. 12, IEEE Photonics Technology Letters.
Kenji Nakamura et al., "Numerical Analysis of the Absorption and the Refractive Index Change in Arbitrary Semiconductor Quantum-Well Structures", Jul. 1992, pp. 1670-1677, vol. 28, No. 7, IEEE Journal of Quantum Electronics.
Charles Garvin et al., "Overview of high-speed multiple quantum well optical modulator devices and their applications at Lockheed Martin Sanders", Jul. 1998, pp. 145-156, Part of the SPIE Conference on Algorithms, Devices, and Sytems for Optical Information Processing.
J. E. Cunningham et al., "Pseudomorphic InGaAsGaAsP quantum well modulators on GaAs", Appl. Phys. Lett., Feb. 1992, pp. 727-729, vol. 60, No. 6, American Institute of Physics.
E. Herbert Li et al., "Quantum-confined Stark effect in interdiffused AlGaAs/GaAs quantum well", Appl. Phys. Lett., Jul. 1993, pp. 533-535, vol. 63, No. 4, American Institute of Physics.

(56) References Cited

OTHER PUBLICATIONS

Zhixin Xu et al., "Quasi-symmetric coupled quantum well and its electro-optical properties", Optoelectronic Materials and Devices for Optical Communitcations, 2005, pp. 1-7, vol. 6020, Proc. of SPIE.

H. Han et al., "High-Speed Modulation of Strain-Compensated InGaAs—GaAsP—InGap Multiple-Quantum-Well Lasers", Sep. 1996, pp. 1133-1135, vol. 8, No. 9, IEEE Photonics Technology Letters.

M. E. Watson et al., "Saturation Intensity and Time Response of InGaAs—InGaP MQW Optical Modulators", Feb. 1995, pp. 254-260, vol. 31, No. 2, IEEE Journal of Quantum Electronics.

K. W. Goossen et al., "Strain-balanced InGaAs/GaAsP multiquantum well reflection modulator operationg near 1.06 μm an GaAs and silicon substrates" Oct. 1993, pp. 1985-1986, vol. 29, No. 22, Electronics Letters.

J. W. Kim et al., "Strained Layer $In_xGa_{1-x}As$/GaAs and $In_xGa_{1-x}As$/$In_yGa_{1-y}P$ Multiple-Quantum-Well Optical Modulators Grown by Gas-Source MBE", Sep. 1993, pp. 987-989, vol. 5, No. 9, IEEE Photonics Technology Letters.

Park, Young-Hwa, et al., "A robust design and fabrication of micromachined electro-absorptive optical modulator for 3D imaging," Proceedings of SPIE, SPIE—International Society for Optical Engineering, US, vol. 8977, Mar. 7, 2014, pp. 89770C-1-89770C-14.

Tackeuchi, Atsushi, et al., "Carrier dynamics of quantum confined structures," Materials Science and Engineering Reports, vol. 22, No. 3, Apr. 1998, pp. 79-111.

LeDeunff, Jeremy, et al., "A primer for resonant tunneling," European Journal of Physics, vol. 33, No. 6, Oct. 8, 2012, pp. 1771-1787.

\* cited by examiner

FIG. 6

| | Material | Thickness[Å] | Remarks | Doping |
|---|---|---|---|---|
| 103 | p-GaAs | 100 | p-contact | $1 \times 10^{18} cm^{-3}$ |
| 111 | $Al_{0.31}Ga_{0.69}As$ | 500 | Cladding | |
| 112 | $GsAs_{0.6}P_{0.4}$ | 58 | Spare barrier | |
| 113c | $In_{0.10}Ga_{0.90}As$ | 20 | Active (CD-3CQW 15pair) | Undoped |
| 114b | GaAs | 15 | | |
| 113b | $In_{0.15}Ga_{0.85}As$ | 50 | | |
| 114a | GaAs | 15 | | |
| 113a | $In_{0.10}Ga_{0.90}As$ | 20 | | |
| 112 | $GsAs_{0.6}P_{0.4}$ | 58 | | |
| 111 | $Al_{0.31}Ga_{0.69}As$ | 500 | Cladding | |
| 102 | n-InGaP | 1000 | n-contact | $2 \times 10^{18} cm^{-3}$ |
| 101 | GaAs substrate | | | |

(Layers 111–111 bracketed as 110)

FIG. 11

| | | Reflection modulator, CD-3 CQW | |
|---|---|---|---|
| | Remarks | Material | Thickness [Å] |
| 341 | Contact | p-GaAs | 100 |
| 340 | Top DBR 1 pair | p-Al$_{0.20}$Ga$_{0.80}$As | 582 |
| | | p-Al$_{0.87}$Ga$_{0.13}$As | 766 |
| | Top DBR 1 pair | p-Al$_{0.20}$Ga$_{0.80}$As | 686 |
| | | p-Al$_{0.87}$Ga$_{0.13}$As | 766 |
| 330 | Cladding | Al$_{0.31}$Ga$_{0.69}$As | 76 |
| | QW/Barrier (2-λ) | 5.8nm — GaAs$_{0.6}$P$_{0.4}$; 1.5nm / 1.5nm GaAs; 2.0nm / 2.0nm In$_{0.10}$Ga$_{0.90}$As; 5.0nm In$_{0.15}$Ga$_{0.85}$As × 29 pairs | |
| | Spare | GaAs$_{0.6}$P$_{0.4}$ | 58 |
| | Cladding | Al$_{0.31}$Ga$_{0.69}$As | 76 |
| 320 | Bot. DBR 25.5 pairs | n-Al$_{0.87}$Ga$_{0.13}$As | 766 |
| | | n-Al$_{0.20}$Ga$_{0.80}$As | 686 |
| | | n-Al$_{0.87}$Ga$_{0.13}$As | 766 |
| 311 | Contact | n-GaAs | 5000 |
| 310 | Substrate | GaAs | 350 μm |

FIG. 14

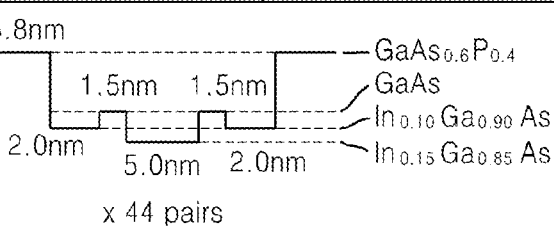

| | Single-cavity(SC) with CD-3 CQW | | |
|---|---|---|---|
| | Remarks | Material | Thickness[Å] |
| 452 | Passivation | $SiO_2$ | 3060 |
| 441 | Contact | p-GaAs | 100 |
| 440 | Top DBR 1 pair | $p-Al_{0.20}Ga_{0.80}As$ | 582 |
| | | $p-Al_{0.87}Ga_{0.13}As$ | 766 |
| | Top DBR 5 pairs | $p-Al_{0.20}Ga_{0.80}As$ | 686 |
| | | $p-Al_{0.87}Ga_{0.13}As$ | 766 |
| 430 | Cladding | $Al_{0.31}Ga_{0.69}As$ | 83 |
| | QW/Barrier (3-λ) | 5.8nm / 1.5nm 1.5nm / 2.0nm 5.0nm 2.0nm — $GaAs_{0.6}P_{0.4}$ / GaAs / $In_{0.10}Ga_{0.90}As$ / $In_{0.15}Ga_{0.85}As$ × 44 pairs | |
| | Spare | $GaAs_{0.6}P_{0.4}$ | 58 |
| | Cladding | $Al_{0.31}Ga_{0.69}As$ | 83 |
| 420 | Bot. DBR 11 pairs | $n-Al_{0.87}Ga_{0.13}As$ | 766 |
| | | $n-Al_{0.20}Ga_{0.80}As$ | 686 |
| 411 | Contact | n-GaAs | 5000 |
| 410 | Substrate | GaAs | 350 μm |
| 451 | AR coating | $SiN_x$ | 1181 |

FIG. 17

| | Remarks | Material | Thickness[Å] |
|---|---|---|---|
| | Micro-cavity, CD-3 CQW | | |
| 552 | Passivation | $SiO_2$ | 3060 |
| 561 | Contact | p-GaAs | 100 |
| 540 / 542 | Top DBR 1 pair | p-$Al_{0.20}Ga_{0.80}As$ | 582 |
| | | p-$Al_{0.87}Ga_{0.13}As$ | 766 |
| | Top DBR 3 pairs | p-$Al_{0.20}Ga_{0.80}As$ | 686 |
| | | p-$Al_{0.87}Ga_{0.13}As$ | 766 |
| 545 | Micro-cavity | p-$Al_{0.20}Ga_{0.80}As$ | 1372 |
| 546 | Phase matching | p-$Al_{0.87}Ga_{0.13}As$ | 766 |
| 541 | Middle DBR 14 pairs | p-$Al_{0.20}Ga_{0.80}As$ | 686 |
| | | p-$Al_{0.87}Ga_{0.13}As$ | 766 |
| 530 | Cladding | $Al_{0.31}Ga_{0.69}As$ | 82 |
| | QW/Barrier (7-λ) | $GaAs_{0.6}P_{0.4}$ / GaAs / $In_{0.10}Ga_{0.90}As$ / $In_{0.15}Ga_{0.85}As$ (5.8nm, 1.5nm, 2.0nm, 4.5nm, 2.0nm, 2.0nm, 5.0nm, 2.0nm) × 54 pairs and × 53 pairs | |
| | Spare | $GaAs_{0.6}P_{0.4}$ | 58 |
| | Cladding | $Al_{0.31}Ga_{0.69}As$ | 82 |
| 520 / 522 | Middle DBR 14 pairs | n-$Al_{0.87}Ga_{0.13}As$ | 766 |
| | | n-$Al_{0.20}Ga_{0.80}As$ | 686 |
| 526 | Phase matching | n-$Al_{0.87}Ga_{0.13}As$ | 766 |
| 525 | Micro-cavity | n-$Al_{0.20}Ga_{0.80}As$ | 1372 |
| 521 | Bot. DBR 8 pairs | n-$Al_{0.87}Ga_{0.13}As$ | 766 |
| | | n-$Al_{0.20}Ga_{0.80}As$ | 686 |
| 511 | Contact | n-GaAs | 5000 |
| 510 | Substrate | GaAs | 350 μm |
| 551 | AR coating | $SiN_x$ | 1181 |

FIG. 20

| | Tandem-cavity, CD-3 CQW | | |
|---|---|---|---|
| Remarks | | Material | Thickness[Å] |
| 672 — Passivation | | SiO$_2$ | 3060 |
| 661 — Contact | | n-GaAs | 100 |
| 660 { | Top DBR 1 pairs | n-Al$_{0.20}$Ga$_{0.80}$As | 582 |
| | | n-Al$_{0.87}$Ga$_{0.13}$As | 766 |
| | Top DBR 1 pairs | n-Al$_{0.20}$Ga$_{0.80}$As | 686 |
| | | n-Al$_{0.87}$Ga$_{0.13}$As | 766 |
| 650 { | Cladding | Al$_{0.31}$Ga$_{0.69}$As | 97 |
| | QW/Barrier (3-λ) | 5.8nm / 1.5nm / 2.0nm / 4.5nm / 2.0nm / 2.0nm / 5.0nm / 2.0nm — GaAs$_{0.6}$P$_{0.4}$ / GaAs / In$_{0.10}$Ga$_{0.90}$As / In$_{0.15}$Ga$_{0.85}$As; x 23 pairs, x 22 pairs | | |
| | Spare | GaAs$_{0.6}$P$_{0.4}$ | 58 |
| | Cladding | Al$_{0.31}$Ga$_{0.69}$As | 97 |
| 640 { | 643 — Middle DBR 5 pairs | p-Al$_{0.87}$Ga$_{0.13}$As | 766 |
| | | p-Al$_{0.20}$Ga$_{0.80}$As | 686 |
| | 646 — Phase matching | p-Al$_{0.87}$Ga$_{0.13}$As | 766 |
| | 641 — Contact | p-GaAs | 300 |
| | 645 — Phase matching | p-Al$_{0.20}$Ga$_{0.80}$As | 375 |
| | 642 — Middle DBR 5 pairs | p-Al$_{0.87}$Ga$_{0.13}$As | 766 |
| | | p-Al$_{0.20}$Ga$_{0.80}$As | 686 |
| | 644 — Phase matching | p-Al$_{0.87}$Ga$_{0.13}$As | 766 |
| 630 { | Cladding | Al$_{0.31}$Ga$_{0.69}$As | 97 |
| | QW/Barrier (3-λ) | 5.8nm / 1.5nm / 2.0nm / 4.5nm / 2.0nm / 2.0nm / 5.0nm / 2.0nm — GaAs$_{0.6}$P$_{0.4}$ / GaAs / In$_{0.10}$Ga$_{0.90}$As / In$_{0.15}$Ga$_{0.85}$As; x 23 pairs, x 22 pairs | | |
| | Spare | GaAs$_{0.6}$P$_{0.4}$ | 58 |
| | Cladding | Al$_{0.31}$Ga$_{0.69}$As | 97 |
| 620 — | Bot. DBR 6 pairs | n-Al$_{0.87}$Ga$_{0.13}$As | 766 |
| | | n-Al$_{0.20}$Ga$_{0.80}$As | 686 |
| 611 — Contact | | n-GaAs | 5000 |
| 610 — Substrate | | GaAs | 350 μm |
| 671 — AR coating | | SiN$_x$ | 1181 |

OPTICAL DEVICE INCLUDING THREE-COUPLED QUANTUM WELL STRUCTURE

RELATED APPLICATIONS

This application claims priority from Korean Patent Application No. 10-2014-0040746, filed on Apr. 4, 2014, in the Korean Intellectual Property Office, the disclosure of which is incorporated herein in its entirety by reference.

BACKGROUND

1. Field

Example embodiments relate to an optical device including a three-coupled quantum well structure, and/or to an optical device including a three-coupled quantum well structure, which may improve the light absorption intensity in a multiple quantum well structure without increasing a driving voltage.

2. Description of the Related Art 3D cameras typically have not only a general image capturing function, but also a function of measuring a distance from a plurality of points on a surface of an object. A variety of algorithms for measuring the distance between an object and a 3D camera have recently been suggested. A typical algorithm is a time-of-flight (TOF) algorithm. According to the TOF algorithm, illumination light is emitted onto an object, and a flight time until the illumination light reflected from the object is received by a light-receiving unit is measured. The flight time of illumination light may be obtained by measuring a phase delay of the illumination light. A high-speed optical modulator is used to accurately measure the phase delay.

An optical modulator having superior electro-optical response characteristics is typically used to obtain a 3D image with high distance accuracy. Recently, a GaAs-based semiconductor optical modulator is used. The GaAs-based semiconductor optical modulator has a P-I-N diode structure in which a multiple quantum well (MQW) structure is disposed between a P-electrode and an N-electrode. In the structure, when a reverse bias voltage is applied between the P-N electrodes, the MQW structure forms excitons in a particular wavelength band and absorbs light. An absorption spectrum of the MQW structure characteristically moves toward a long wavelength as a reverse bias voltage increases. Accordingly, a degree of absorption at a particular wavelength may vary according to a change in the reverse bias voltage. Thus, according to the above principle, the intensity of incident light having a particular wavelength may be modulated by adjusting the reverse bias voltage that is applied to an optical modulator.

In the optical modulator, a distance accuracy increases as a contrast ratio, for example, a demodulation contrast, indicating a difference in the degree of absorption between when a voltage is applied and when the voltage is not applied, increases. Driving at a low voltage is advantageous to reduce or prevent performance deterioration due to heat. In general, an increase in the contrast ratio may be achieved by increasing the light absorption intensity and transition energy in the MQW structure. The light absorption intensity is inversely proportional to the thickness of a quantum well layer and is proportional to a value obtained by normalizing a square of a degree of superimposition between a hole's wave function and an electron's wave function in the quantum well layer by a sum of the area of each wave function. Also, transition energy that indicates a degree of an absorption spectrum moving toward a long wavelength is proportional to the fourth power of the thickness of a quantum well layer and to the square of an applied voltage.

However, when the thickness of a quantum well layer is reduced to increase the light absorption intensity, the transition energy decreases and an applied voltage increases in order to compensate for a decrease in the transition energy. Reversely, when the thickness of a quantum well layer is increased to increase the transition energy, the degree of superimposition between a hole's wave function and an electron's wave function decreases, and the generation of excitons by electron-hole pairs is reduced so that absorption intensity decreases. Thus, since a high absorption intensity and a low driving voltage are in a trade-off relationship, it is difficult to simultaneously achieve improvement of the absorption intensity and reduction of the driving voltage.

In a TOF-type 3D camera, light having a wavelength of about 850 nm in an infrared range is generally used as illumination light. Since a GaAs substrate is not transparent with respect to the 850 nm wavelength light, a complicated process of removing the GaAs substrate is added to the process of manufacturing an optical modulator. Recently, to omit the complicated additional process, there have been efforts to use light having a wavelength of about 870 nm or more, for example, about 940 nm, which transmits through the GaAs substrate, as illumination light. However, since a lattice constant of the material of a quantum well layer and a barrier suitable for an optical modulator having a 940 nm resonance wavelength does not match the resonance wavelength of the GaAs substrate, stress and strain may be generated. Unless the stress and strain are compensated, quantum wells of a large number of layers are not stacked and thus it is difficult to increase the absorption intensity of an optical modulator.

SUMMARY

Example embodiments related to an optical device including a three-coupled quantum well structure, which may improve the light absorption intensity in a multiple quantum well structure without increasing a driving voltage.

Additional example embodiments will be set forth in part in the description which follows and, in part, will be apparent from the description, or may be learned by practice of the example embodiments.

According to an example embodiment, an optical device includes a lower reflection layer doped with a first conductive-type dopant, an active layer disposed on the lower reflection layer and including at least two outer barriers and at least one coupled quantum well that is inserted between the at least two outer barriers, and an upper reflection layer disposed on the active layer and doped with a second conductive-type dopant that is electrically opposite to the first conductive-type dopant, in which each coupled quantum well includes at least three quantum well layers and at least two coupling barriers respectively provided between the at least three quantum well layers, thicknesses of two quantum well layers disposed at opposite end portions of the at least three quantum well layers are less than a thickness of the other quantum well layer disposed between the two quantum well layers disposed at the opposite end portions, and energy levels of the two quantum well layers disposed at the opposite end portions are higher than an energy level of the other quantum well layer disposed between the two quantum well layers disposed at the opposite end portions.

Each of the coupled quantum wells may be a three-coupled quantum well that includes a first quantum well layer, a first coupling barrier, a second quantum well layer, a second coupling barrier, and a third quantum well layer, which are sequentially stacked, and energy levels of the first and second coupling barriers are higher than a ground level and lower than energy levels of the outer barriers.

A thickness of the second quantum well layer may be greater than a thickness of the first quantum well layer and a thickness of the third quantum well layer, and an energy level of the second quantum well layer may be lower than an energy level of the first quantum well layer and an energy level of the third quantum well layer.

Thicknesses of the first and second coupling barriers may be the same as or less than thicknesses of the first and third quantum well layers.

In a wavelength range of about 850 nm, the first and third quantum well layers may include AlzGa1-zAs, where 0<z<1, the second quantum well layer includes GaAs, the first and second coupling barriers include AlyGa1-yAs, where z<y<1, and the outer barriers include AlxGa1-xAs, where z<y<x≤1.

The optical device may further include a substrate, in which, in a wavelength range of about 900 nm to about 1050 nm, the first to third quantum well layers may be formed of, or includes, a material having compressive strain with respect to the substrate, and the outer barriers may be formed of, or includes, a material having tensile strain with respect to the substrate.

The first to third quantum well layers may include InxGa1-xAs, where 0.1≤x≤0.2, the first and second coupling barriers may include GaAs, and the outer barriers may include GaAs1-yPy or InyGa1-yP, where 0.4≤y≤0.5.

In a frequency range, the first to third quantum well layers may include at least one of In1-xGaxAs and In1-x-yGax-AlyAs, the first and second coupling barriers may include at least one of In1-x'-y'Gax'Aly'As where x'<x and y<y' and In1-x'Gax'AszP1-z where x'<x, and the outer barriers may include at least one of In1-x"-y"Gax"Aly"As where x"<x'<x and y<y'<y" and In1-x"Gax"Asz'P1-z where x"<x'<x, and z<z', and 0<x, z<1.

The optical device may further include at least one microcavity layer disposed in at least one of the lower and upper reflection layers, in which, when a resonance wavelength of the optical device is λ, the active layer and the at least one microcavity have an optical thickness that is an integer multiple of λ/2.

According to at least one example embodiment, the at least one coupled quantum well may include at least one first coupled quantum well including a first quantum well layer, a first coupling barrier, a second quantum well layer, a second coupling barrier, and a third quantum well layer which are sequentially stacked, and at least one second coupled quantum well including a fourth quantum well layer, a third coupling barrier, a fifth quantum well layer, a fourth coupling barrier, and a sixth quantum well layer which are sequentially stacked, and a thickness of the second quantum well layer of the first coupled quantum well is different from a thickness of the fifth quantum well layer of the second coupled quantum well.

Energy levels of the first to fourth coupling barriers may be higher than a ground level and lower than energy levels of the outer barriers.

The thickness of the second quantum well layer may be greater than a thickness of the first quantum well layer and a thickness of the third quantum well layer, and a thickness of the fifth quantum well layer may be greater than a thickness of the fourth quantum well layer and a thickness of the sixth quantum well layer.

An energy level of the second quantum well layer may be lower than an energy level of the first quantum well layer and an energy level of the third quantum well layer, and an energy level of the fifth quantum well layer may be lower than an energy level of the fourth quantum well layer and an energy level of the sixth quantum well layer.

Thicknesses of the first and third quantum well layers of the first coupled quantum well may be respectively the same as thicknesses of the fourth and sixth quantum well layers of the second coupled quantum well.

The optical device may be a reflective optical modulator, in which a reflectance of the lower reflection layer is higher than a reflectance of the upper reflection layer.

The optical device may be a transmissive optical modulator and may further include an anti-reflection coating disposed under the lower reflection layer.

According to another example embodiment, an optical device includes a lower reflection layer doped with a first conductive-type dopant, a first active layer disposed on the lower reflection layer, an intermediate reflection layer disposed on the first active layer and doped with a second conductive-type dopant that is electrically opposite to the first conductive-type dopant, a second active layer disposed on the intermediate reflection layer, and an upper reflection layer disposed on the second active layer and doped with the first conductive-type dopant, in which at least one of the first and second active layers includes at least two outer barriers and at least one coupled quantum well between the at least two outer barriers, each coupled quantum well includes at least three quantum well layers and at least two coupling barriers provided between the at least three quantum well layers, thicknesses of two quantum well layers disposed at opposite end portions of the at least three quantum well layers may be lower than a thickness of the other quantum well layer disposed between the two quantum well layers disposed at the opposite end portions, and energy levels of the two quantum well layers disposed at the opposite end portions are higher than an energy level of the other quantum well layer disposed between the two quantum well layers disposed at the opposite end portions.

According to at least one example embodiment, each one of the coupled quantum wells may be a three-coupled quantum well that includes a first quantum well layer, a first coupling barrier, a second quantum well layer, a second coupling barrier, and a third quantum well layer which are sequentially stacked, energy levels of the first and second coupling barriers may be higher than a ground level and lower than energy levels of the outer barriers, a thickness of the second quantum well layer may be greater than a thickness of both the first quantum well layer and the third quantum well layer, and an energy level of the second quantum well layer may be lower than an energy level of the first quantum well layer and an energy level of the third quantum well layer.

The at least one coupled quantum well may include at least one first coupled quantum well including a first quantum well layer, a first coupling barrier, a second quantum well layer, a second coupling barrier, and a third quantum well layer which are sequentially stacked, and at least one second coupled quantum well including a fourth quantum well layer, a third coupling barrier, a fifth quantum well layer, a fourth coupling barrier, and a sixth quantum well layer which are sequentially stacked, and a thickness of the second quantum well layer of the first coupled quantum well may be different from a thickness of the fifth quantum well layer of the second coupled quantum well.

The thickness of the second quantum well layer may be greater than a thickness of both the first quantum well layer and the third quantum well layer, and a thickness of the fifth quantum well layer may be greater than a thickness of both the fourth quantum well layer and of the sixth quantum well layer, and an energy level of the second quantum well layer may be lower than an energy level of the first quantum well layer and an energy level of the third quantum well layer, and an energy level of the fifth quantum well layer may be lower than an energy level of the fourth quantum well layer and an energy level of the sixth quantum well layer.

At least one example embodiment relates to an optical device including a lower reflection layer, an active layer on the lower reflection layer, the active layer including at least two outer barriers and at least one coupled quantum well between the at least two outer barriers, and an upper reflection layer on the active layer, each coupled quantum well including at least three quantum well layers connected to one another via at least two coupling barriers, thicknesses of two quantum well layers at opposite ends of the coupled quantum well being smaller than a thickness of another quantum well layer between the two quantum well layers, and band gaps of the two quantum well layers at the opposite ends being higher than a band gap of the other quantum well layer.

BRIEF DESCRIPTION OF THE DRAWINGS

These and/or other example embodiments will become apparent and more readily appreciated from the following description, taken in conjunction with the accompanying drawings in which:

FIG. 6 illustrates a detailed example of an optical device having a three-coupled quantum well structure that is designed to have a 940 nm resonance wavelength, according to at least one example embodiment;

FIG. 11 illustrates a detailed example of the reflective optical modulator of FIG. 10, according to at least one example embodiment;

FIG. 14 illustrates a detailed example of the transmissive optical modulator of FIG. 13, according to at least one example embodiment;

FIG. 17 illustrates a detailed example of the transmissive optical modulator of FIG. 16, according to at least one example embodiment;

FIG. 20 illustrates a detailed example of the transmissive optical modulator of FIG. 19, according to at least one example embodiment.

DETAILED DESCRIPTION

Figure 1:
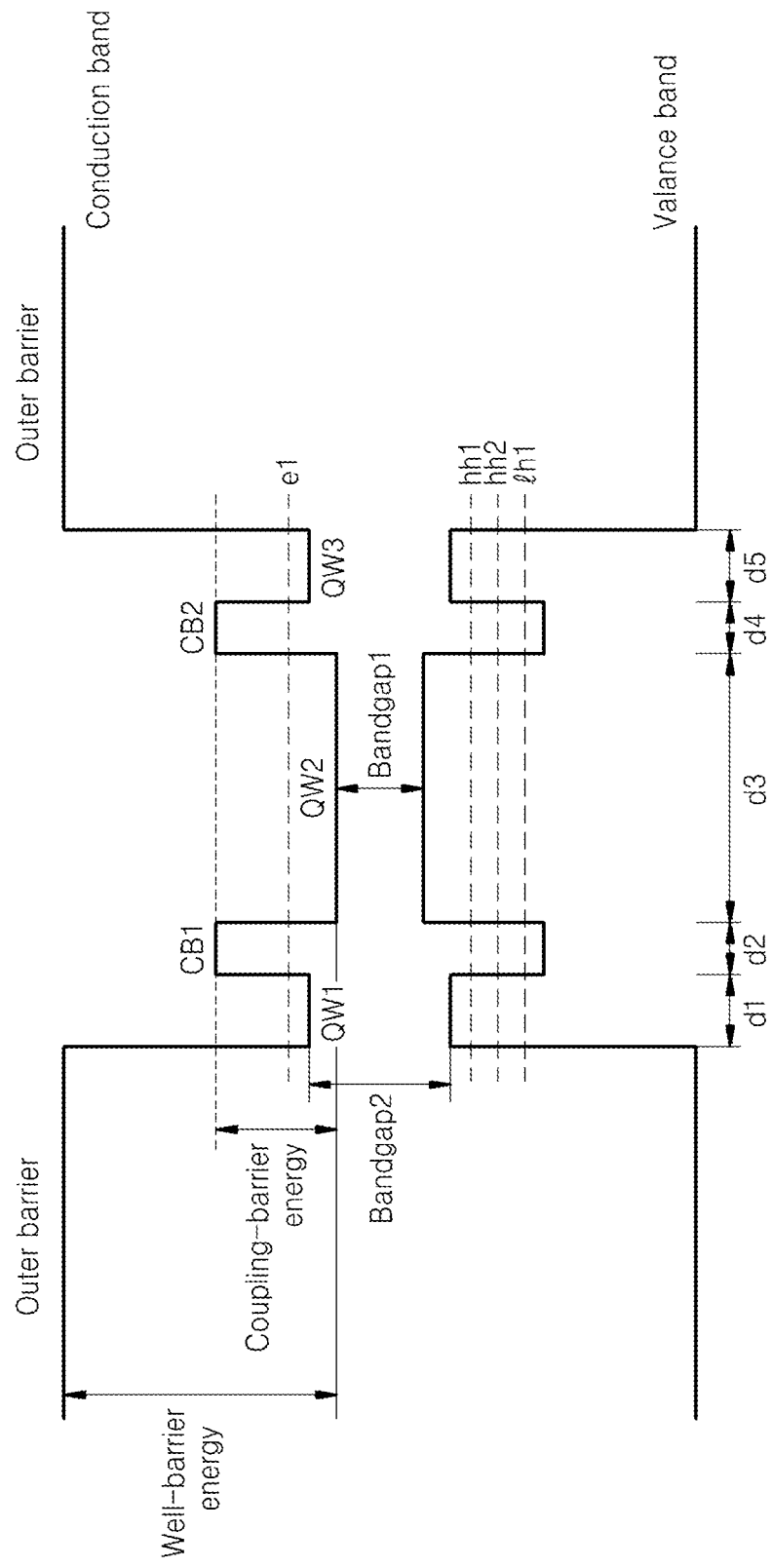
FIG. 1 is an energy band diagram of an active layer having a three-coupled quantum well structure, according to an example embodiment.

Reference will now be made in detail to an optical device including a three-coupled quantum well structure, examples of which are illustrated in the accompanying drawings, wherein like reference numerals refer to like elements throughout. Also, the size of each layer illustrated in the drawings may be exaggerated for convenience of explanation and clarity. In this regard, the example embodiments may have different forms and should not be construed as being limited to the descriptions set forth herein. Accordingly, the example embodiments are merely described below, by referring to the figures, to explain the example description.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

FIG. 1 schematically illustrates an energy band diagram of an active layer having a three-coupled quantum well structure, according to an example embodiment. Referring to FIG. 1, the active layer according to the example embodiment may include two outer barriers and a three-coupled quantum well inserted between the two outer barriers. Although FIG. 1 illustrates only two outer barriers and one three-coupled quantum well, more outer barriers and three-coupled quantum wells may be alternately disposed. For example, the active layer may include at least two outer barriers and at least one three-coupled quantum well inserted between the at least two outer barriers.

Each three-coupled quantum well may include a first quantum well layer QW1, a first coupling barrier CB1, a second quantum well layer QW2, a second coupling barrier CB2, and a third quantum well layer QW3, which may be sequentially disposed. In the three-coupled quantum well structure, three quantum well layers may be coupled to one another by two coupling barriers. Accordingly, in the overall structure of the active layer, a three-coupled quantum well may perform a similar or a same function to a single quantum well. As a result, since the overall thickness of the three-coupled quantum well structure that functions as a single quantum well layer is thicker than the overall thickness of a single quantum well layer, transition energy may be increased without increasing a driving voltage.

To couple the three quantum well layers, namely, the first to third quantum well layers QW1 to QW3, arranged between two outer barriers, the two coupling barriers, namely, the first and second coupling barriers CB1 and CB2, may be thin and have an energy level that is lower than the energy level of the outer barriers, as illustrated in FIG. 1. For example, in a conduction band on an upper side of the energy band diagram of FIG. 1, energy levels of the first and second coupling barriers CB1 and CB2 may be higher than a ground level, that is, an energy level of a first electron e1, and lower than the energy level of the outer barriers. Likewise, in a valance band on a lower side of the energy band diagram of FIG. 1, the energy level of the first and second coupling barriers CB1 and CB2 may be higher than a ground level, that is, an energy level of a first heavy hole hh1, and lower than the energy level of the outer barriers. Also, the energy level of the first and second coupling barriers CB1 and CB2 may be higher than the energy levels of a second heavy hole hh2 and a first light hole lh1. As a result, band gaps of the quantum wells QW1 and QW3 are greater than the band gap of the quantum well QW2. The first and second coupling barriers CB1 and CB2 are formed to be thin enough for tunneling of electrons and holes to occur. For example, thicknesses d2 and d4 of the first and second coupling barriers CB1 and CB2 may be equal to or less than thicknesses d1 and d5 of the first and third quantum well layers QW1 and QW3. For example, the thicknesses d2 and d4 of the first and second coupling barriers CB1 and CB2 may be about 1-2 nm.

In general, when a degree of superimposition between a hole's wave function and an electron's wave function is large, the generation of excitons that are pairs of an electron and a hole increases, and light absorption intensity of an optical device increases as a result. According to at least one example embodiment, to improve the light absorption intensity of an optical device including the active layer of FIG. 1, the thickness of the second quantum well layer QW2 may be formed to be the largest thickness so that a portion where the hole's wave function and the electron's wave function are superimposed is increased. As the thickness of the second quantum well layer QW2 may be formed to be the largest thickness, a hole's wave function portion and an electron's wave function portion remaining in the second quantum well layer QW2 increase so that superimposition between the hole's wave function and the electron's wave function may be increased. In other words, the thicknesses d1 and d5 of the first and third quantum well layers QW1 and QW3 may be lower than a thickness d3 of the second quantum well layer QW2 arranged therebetween. However, when the thicknesses d1 and d5 of the first and third quantum well layers QW1 and QW3 excessively decrease, not only a driving voltage increases but also a very delicate process control is required in a manufacturing process. Considering the above matter, the thicknesses d1, d3, and d5 of the first, second, and third quantum well layers QW1, QW2, and QW3 may be appropriately selected. For example, the thicknesses d1 and d5 of the first and third quantum well layers QW1 and QW3 may be about 1-2 nm, and the thickness d3 of the second quantum well layer QW2 may be about 4-5 nm.

In terms of energy levels, the energy levels of the first, second, and third quantum well layers QW1, QW2, and QW3 are lower than the ground level. In particular, the energy level of the second quantum well layer QW2 may be set to be lower than the energy levels of the first and third quantum well layers QW1 and QW3, as illustrated in FIG. 1, so that strong light absorption may occur in the second quantum well layer QW2. Accordingly, Bandgap 1 of the second quantum well layer QW2 may be selected to be smaller than Bandgap 2 of the first and third quantum well layers QW1 and QW3. The thicknesses and energy levels of the first and third quantum well layers QW1 and QW3 may be the same as or different from each other. Accordingly, the quantum well structure of the example embodiment has a structure in which a center portion is deeper than opposite side portions in the energy levels of the first, second, and third quantum well layers QW1, QW2, and QW3. In such a structure, as the widths of the first, second, and third quantum well layers QW1, QW2, and QW3 increase, the ground level is lowered and an absorption wavelength moves toward a long wavelength. When the barrier energies of the first and second coupling barriers CB1 and CB2 increase, the ground level rises and thus the absorption wavelength may be moved toward a short wavelength.

When the energy levels of the first and third quantum well layers QW1 and QW3 are lower than the energy levels of the second quantum well layer QW2, a difference in the energy between the first and third quantum well layers QW1 and QW3 and the outer barrier increases so that stress may increase. As such, because the thickness of the outer barrier increases to endure the stress, loss of carriers may increase, an operation voltage may increase, and light absorption may decrease. In the example embodiment, since the stress is reduced by decreasing the difference in the energy between the first and third quantum well layers QW1 and QW3 and the outer barrier, the thickness of the outer barrier may be reduced. When the thickness of the outer barrier decreases, the number of quantum well layers that may be arranged within a predetermined, or alternatively desired, thickness range may increase accordingly, thereby reducing the loss of carriers. Accordingly, an operation voltage may decrease and light absorption intensity may increase.

Materials for the first, second, and third quantum well layers QW1, QW2, and QW3, the first and second coupling barriers CB1 and CB2, and the outer barriers satisfying the above conditions may be diversely selected according to a wavelength band to use. For example, for an infrared range of about 900 nm to 1050 nm, $In_xGa_{1-x}As$ having compressive strain with respect to a GaAs substrate may be used for the first to third quantum well layers QW1 to QW3, and $GaAs_{1-y}P_y$ or $In_yGa_{1-y}P$ having tensile strain with respect to the GaAs substrate may be used for the outer barriers. In this example embodiment, $0.1 \leq x \leq 0.2$ and $0.4 \leq y \leq 0.5$. Since a material having compressive strain is used for the first to third quantum well layers QW1 to QW3 and a material having tensile strain is used for the outer barriers, stress may be generally compensated for. GaAs having the same lattice constant as the GaAs substrate may be used for the first and second coupling barrier lays CB1 and CB2.

Also, for an infrared range of about 850 nm, for example, $Al_zGa_{1-z}As$ ($0<z<1$) may be used for the first and third quantum well layers QW1 and QW3, GaAs may be used for the second quantum well layer QW2, $Al_yGa_{1-y}As$ ($z<y<1$) may be used for the first and second coupling barrier lays CB1 and CB2, and $Al_xGa_{1-x}As$ ($z<y<x \leq 1$) may be used for the outer barriers. In this case, because the materials of the first to third quantum well layers QW1 to QW3 and the first and second coupling barrier lays CB1 and CB2 have almost or substantially the same lattice constant as the lattice constant of the GaAs substrate, strain is hardly generated with respect to the GaAs substrate.

Also, for an infrared range of about 1550 nm, a variety of combinations of materials may be used, for example, $In_{1-x}Ga_xAs$ and/or $In_{1-x-y}Ga_xAl_yAs$ may be used for the first to third quantum well layers QW1 to QW3, $In_{1-x'-y'}Ga_{x'}Al_{y'}As$ ($x'<x$ and $y<y'$) and/or $In_{1-x'}Ga_{x'}As_zP1_{-z}$ ($x'<x$) may be used for the first and second coupling barrier lays CB1 and CB2, and $In_{1-x''-y''}Ga_{x''}Al_{y''}As$ ($x''<x'<x$ and $y<y'<y''$) and/or $In_{1-x''}Ga_{x''}As_{z'}P_{1-z'}$ ($x''<x'<x$ and $z<z'$) may be used for the outer barriers. In this case, InP may be used for a substrate and the materials of the quantum well layer and the outer barrier may be selected from materials capable of compensating for stress between the quantum well layer and the outer barrier. In this example embodiment, $0<x, y, z21$ 1.

Figure 2A:
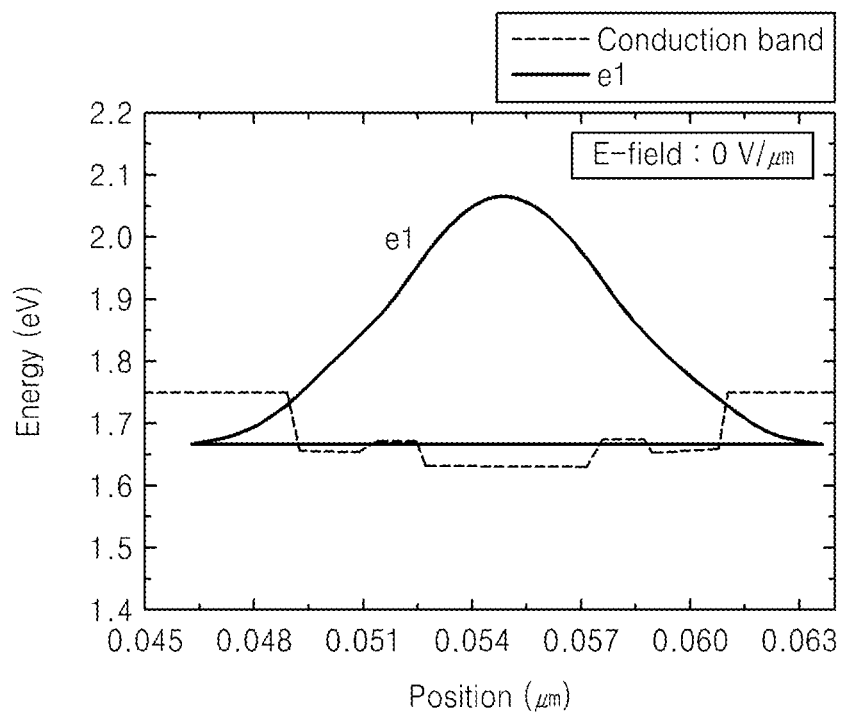
FIGS. 2A and 2B respectively illustrate an electron's wave function and a hole's wave function when a reverse bias voltage is not applied to the active layer of FIG. 1, according to at least one example embodiment.
Figure 2B:
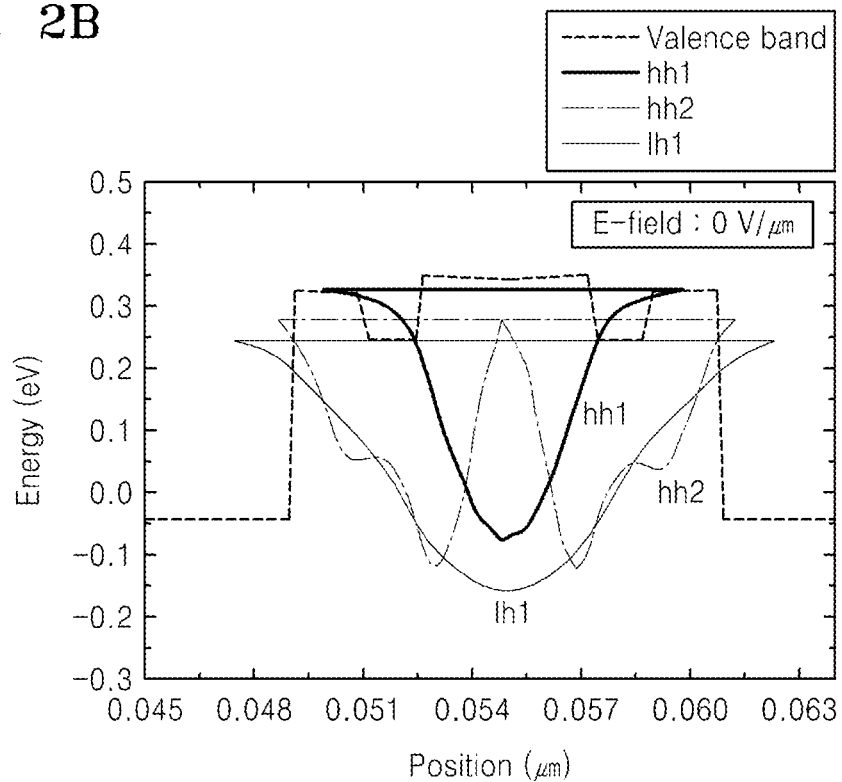

Since the first, second, and third quantum well layers QW1, QW2, and QW3 are connected to one another by the first and second coupling barriers CB1 and CB2, electron's and hole's wave functions may be distributed across the first, second, and third quantum well layers QW1, QW2, and QW3 over the first and second coupling barriers CB1 and CB2. For example, FIGS. 2A and 2B respectively illustrate an example electron's wave function and a hole's wave function when a reverse bias voltage is not applied to the active layer of FIG. 1. Referring to FIG. 2A, a wave function of a first electron e1 is distributed across the three quantum well layers, namely, the first, second, and third quantum well layers QW1, QW2, and QW3, mainly in the second quantum well layer QW2. A second electron e2 does not form a wave function because a difference in the energy level between the first and second coupling barrier lays CB1 and CB2 and the first to third quantum well layers QW1 to QW3 is small and thus the second electron e2 is not confined within the first to third quantum well layers QW1 to QW3. Referring to FIG. 2B, wave functions of a first heavy hole hh1, a first light hole lh1, and a second heavy hole hh2 are distributed across the three quantum well layers, namely, the first, second, and third quantum well layers QW1, QW2, and QW3. In particular, the wave functions of the first heavy hole hh1 and the first light hole lh1 are mainly distributed in the center of the second quantum well layer QW2. The wave function of the second heavy hole hh2 is mainly distributed at the edge of the second quantum well layer QW2.

Figure 3A:
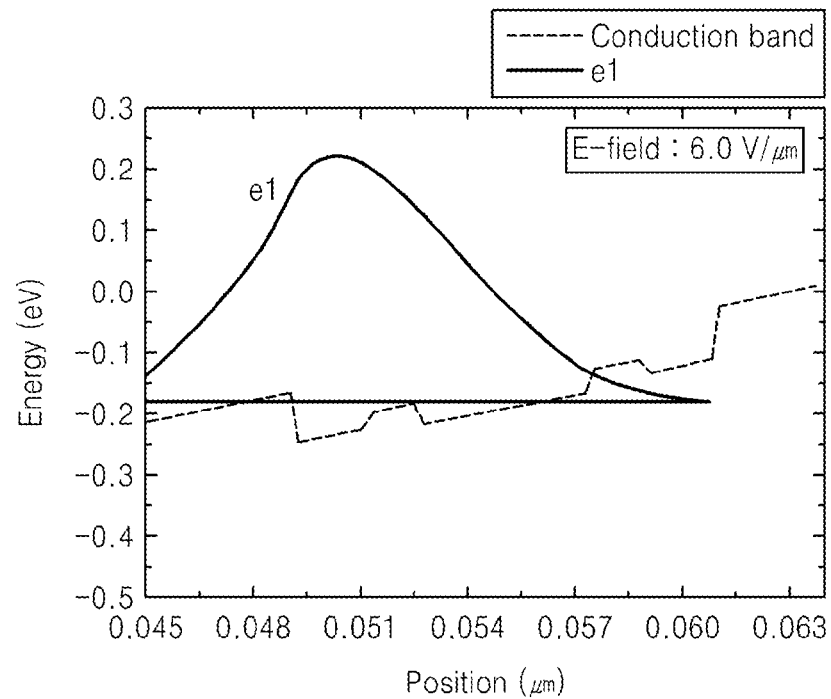
FIGS. 3A and 3B respectively illustrate an electron's wave function and a hole's wave function when a reverse bias voltage is applied to the active layer of FIG. 1, according to at least one example embodiment.

According to at least one example embodiment, when a reverse bias voltage is applied to the active layer, the electron's wave function moves in a direction toward the first quantum well layer QW1 and the hole's wave function moves in a direction toward the third quantum well layer QW3. For example, FIGS. 3A and 3B respectively illustrate the example electron's wave function and the hole's wave function when the reverse bias voltage is applied to the active layer of FIG. 1. Referring to FIG. 3A, as the reverse bias voltage increases, a peak of the wave function of the first electron e1 moves toward the first quantum well layer QW1. Even when the reverse bias voltage is applied to the active layer, the wave function of the first electron e1 is widely distributed across the three quantum well layers, namely, the first, second, and third quantum well layers QW1, QW2, and QW3. At least a part of the wave function of the first electron e1 still remains in the second quantum well layer QW2. Also, referring to FIG. 3B, due to low mobility of the first heavy hole hh1, the first heavy hole hh1 remains in the second quantum well layer QW2 even when the reverse bias voltage is applied to the active layer. In contrast, the first light hole lh1 and the second heavy hole hh2 move toward a right direction. In particular, the second heavy hole hh2 is confined in the third quantum well layer QW3 crossing the second coupling barrier CB2 so that a degree of superimposition with the wave function of the first electron e1 is low. However, because a degree of superimposition of the wave functions of the first heavy hole hh1 and the first light hole lh1 with the wave function of the first electron e1 is high, a relatively strong absorption intensity may be obtained.

Figure 4:
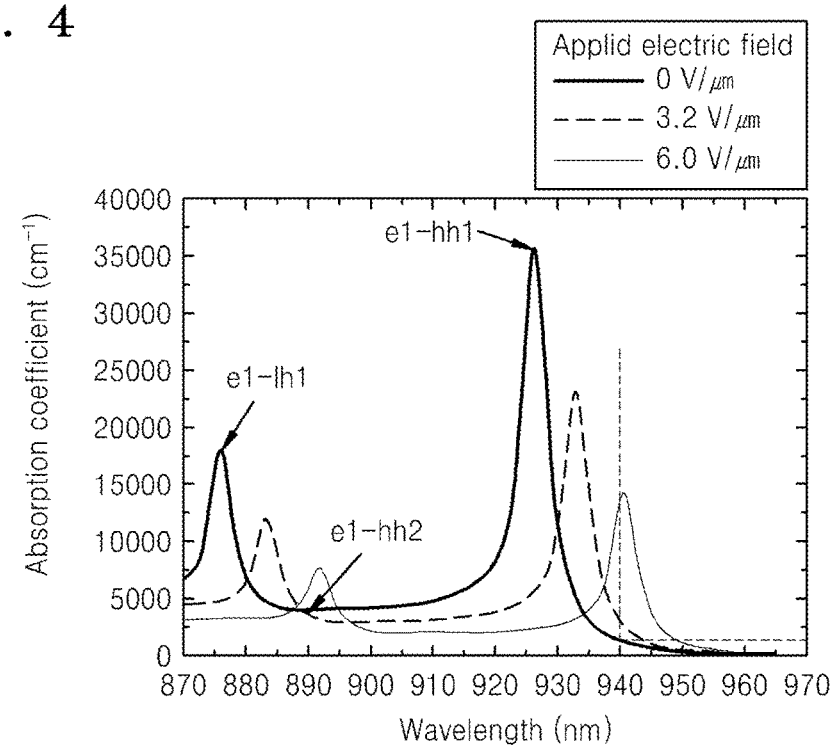
FIG. 4 illustrates an absorption spectrum in the active layer having the three-coupled quantum well structure of FIG. 1, according to at least one example embodiment.

FIG. 4 illustrates an example absorption spectrum in the active layer having the three-coupled quantum well structure of FIG. 1, in detail, absorption spectrums with respect to externally applied electric fields of about 0 V/μm, about 3.2 V/μm, and about 6.0 V/μm. Referring to FIG. 4, when the externally applied electric field is about 0 V/μm, the largest peak is generated at a wavelength of about 926 nm. The largest peak is generated by an exciton pair (e1-hh1) of the first electron e1 and the first heavy hole hh1 and the second largest peak is generated by an exciton pair (e1-lh1) of the first electron e1 and the first light hole lh1. Since an absorption coefficient is very small at the wavelength of about 940 nm, light having a wavelength of about 940 nm mostly passes through the active layer. When the externally applied electric field increases, an absorption spectrum moves toward a long wavelength according to the Stark effect and absorption intensity is reduced. When the externally applied electric field is about 6.0 V/μm, the absorption spectrum has the largest peak at a wavelength of about 940 nm. In this case, the peak of the absorption spectrum is lower than in a case when the externally applied electric field is about 0 V/μm. The above movement of the absorption spectrum toward the wavelength of about 940 nm may be achieved at an externally applied electric field of about 8.5 V/μm in a simple single quantum well structure. Also, when the electric field is about 0 V/μm, although an absorption coefficient is about 18,000/cm at a wavelength of about 926 nm in a simple single quantum well, the absorption coefficient is increased to about 35,000/cm in the example embodiment.

Figure 3B:
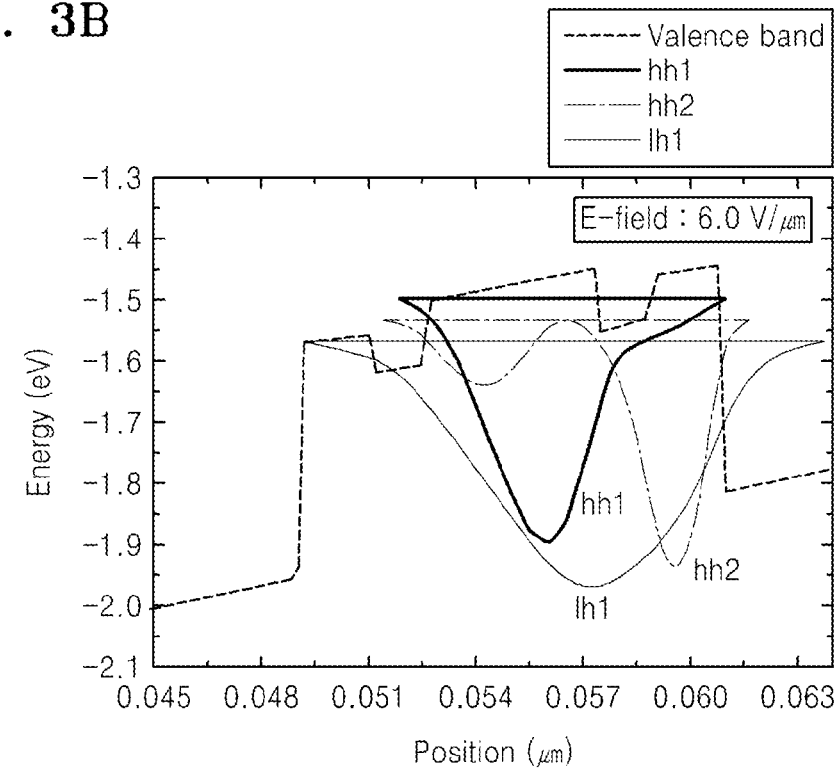

According to the example embodiment, even when an external electric field of about 6.0 V/μm is applied to the active layer, as illustrated in FIGS. 3A and 3B, a considerable amount of the electron's and hole's wave functions remains in the second quantum well layer QW2 and thus a degree of superimposition is high. Accordingly, an absorption coefficient that is higher than the absorption coefficient of the simple single quantum well structure may be maintained. In other words, in the example embodiment, a degree that absorption intensity decreases as the absorption spectrum moves toward a long wavelength is less than the degree of the simple single quantum well structure. Accordingly, a difference Δα in the absorption intensity at a wavelength of about 940 μm between when the externally applied electric field is about 0 V/μm, and when the externally applied electric field is about 6.0 V/μm, may be larger than the absorption intensity of the simple single quantum well structure.

Figure 5:
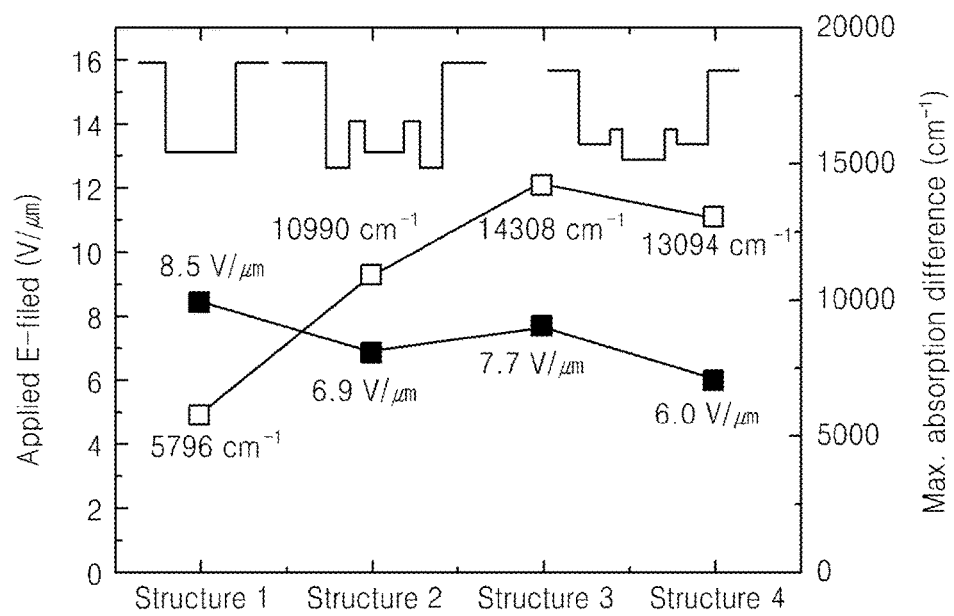
FIG. 5 illustrates a light absorption characteristic in the active layer having the three-coupled quantum well structure of FIG. 1, according to at least one example embodiment, in comparison with a simple single quantum well structure.

For example, FIG. 5 illustrates a light absorption characteristic in the active layer having the three-coupled quantum well structure of FIG. 1, in comparison with other quantum well structures. In the graph of FIG. 5, Structure 1 is a single quantum well structure including an $In_{0.15}Ga_{0.85}As$ quantum well layer having a thickness of about 7.6 nm and a $GaAs_{0.6}P_{0.4}$ barrier having a thickness of about 5.8 nm. Structure 2 is a three-coupled quantum well structure including outer barriers formed of, or includes, $GaAs_{0.6}P_{0.4}$ to a thickness of about 6.7 nm, first and second coupling barriers CB1 and CB2 formed of, or includes, GaAs to a thickness of about 1.5 nm, first and third quantum well layers QW1 and QW3 formed of, or includes, $In_{0.20}Ga_{0.80}As$ to a thickness of about 1.5 nm, and a second quantum well layer QW2 formed of, or includes, $In_{0.15}Ga_{0.85}As$ to a thickness of about 4.9 nm. In the three-coupled quantum well structure of Structure 2, contrary to the example embodiment, the energy levels of the first and third quantum well layers QW1 and QW3 are lower than the energy level of the second quantum well layer QW2. Structure 3 is a three-coupled quantum well structure including outer barriers formed of, or includes, $GaAs_{0.6}P_{0.4}$ to a thickness of about 5.7 nm, first and second coupling barriers CB1 and CB2 formed of, or includes, GaAs to a thickness of about 1.5 nm, first and third quantum well layers QW1 and QW3 formed of, or includes, $In_{0.10}Ga_{0.90}As$ to a thickness of about 1.5 nm, and a second quantum well layer QW2 formed of, or includes, $In_{0.15}Ga_{0.85}As$ to a thickness of about 5.5 nm. Lastly, Structure 4 is a three-coupled quantum well structure including outer barriers formed of, or includes, $GaAs_{0.6}P_{0.4}$ to a thickness of about 5.8 nm, first and second coupling barriers CB1 and CB2 formed of, or includes, GaAs to a thickness of about 1.5 nm, first and third quantum well layers QW1 and QW3 formed of, or includes, $In_{0.10}Ga_{0.90}As$ to a thickness of about 2.0 nm, and a second quantum well layer QW2 formed of, or includes, $In_{0.15}Ga_{0.85}As$ to a thickness of about 5.0 nm. Structures 3 and 4 are three-coupled quantum well structures according to the example embodiment. In Structure 4, the thicknesses of the first and third quantum well layers QW1 and QW3 are increased and the thickness of the second quantum well layer QW2 is decreased, compared with Structure 3.

Referring to FIG. 5, the amount of electric field for an absorption peak to reach 940 nm is in the order of Structure 4, Structure 2, Structure 3, and Structure 1. A driving voltage of Structure 4 is about 6.0 V/μm, which is decreased by 29.4%, compared to 8.5 V/μm that is a driving voltage of Structure 1, and decreased by 13%, compared to 6.9 V/μm that is a driving voltage of Structure 2. In terms of the absorption coefficient indicating light absorption, excitons of e1-hh1 become a maximum at around 926 nm and absorption intensity decreases toward a long wavelength according to an increase in voltage. Comparison of the absorption coefficient difference between a state where a driving voltage is applied and a non-voltage state where a driving voltage is not applied shows an order of Structure 1, Structure 2, Structure 4, and Structure 3. The absorption characteristic of Structure 3 is improved 126%, compared to the absorption characteristic of Structure 1, and 19.1%, compared to that of Structure 2. In terms of the absorption characteristic only, although Structure 3, in which the thicknesses of the first and third quantum well layers QW1 and QW3 are relatively thinner, is superior to Structure 4, the driving voltage of Structure 3 is excessively higher than the driving voltage of Structure 4. Also, Structure 4, in which the thicknesses of the first and third quantum well layers QW1 and QW3 are relatively thicker, is easily manufactured, compared to Structure 3.

FIG. 6 illustrates an example of an optical device 100 having a three-coupled quantum well structure that is designed to have a resonance wavelength of about 940 nm. Referring to FIG. 6, an n-contact layer 102 is formed of, or includes, n-InGaP to a thickness of about 100 nm on a GaAs substrate 101. An $Al_{0.31}Ga_{0.69}As$ cladding layer 111 is formed on the n-contact layer 102 to a thickness of about 50 nm. Fifteen (15) pairs of $GaAs_{0.6}P_{0.4}$ having a thickness of about 5.8 nm as an outer barrier 112, $In_{0.10}Ga_{0.90}As$ having a thickness of about 2.9 nm as a first quantum well layer 113a, GaAs having a thickness of about 1.5 nm as a first coupling barrier 114a, $In_{0.15}Ga_{0.85}As$ having a thickness of about 5.0 nm as a second quantum well layer 113b, GaAs having a thickness of about 1.5 nm as a second coupling barrier 114b, and $In_{0.10}Ga_{0.90}As$ having a thickness of about 2.0 nm as a third quantum well layer 113c are repeatedly stacked on and about the cladding layer 111. $GaAs_{0.6}P_{0.4}$ is formed to have a thickness of about 5.8 nm as a final outer barrier 112 on the 15$^{th}$ third quantum well layer 113c. An $Al_{0.31}Ga_{0.69}As$ cladding layer 111 is formed again to a thickness of about 50 nm on the final outer barrier 112. A p-contact layer 103 is formed of, or includes, p-GaAs to a thickness of about 10 nm on the $Al_{0.31}Ga_{0.69}As$ cladding layer 111. The cladding layer 111 may be formed to be relatively thick so as to function as a diffusion prevention layer to reduce or prevent diffusion of dopants of the n- and p-contact layers 102 and 103 into the first, second, and third quantum well layers 113a, 113b, and 113c. The above layers may be stacked by using equipment for molecular beam epitaxy (MBE) or metal organic chemical vapor deposition (MOCVD). Since light having a 940 nm wavelength is transmissive through GaAs, the GaAs substrate 101 may not be removed.

Figure 7:
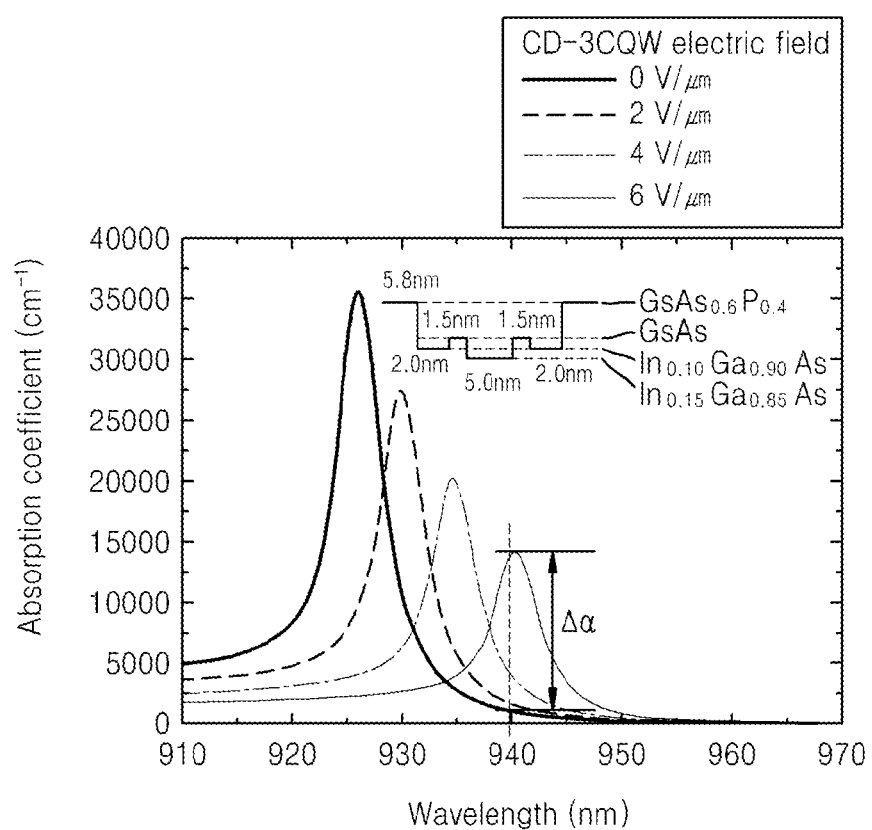
FIG. 7 schematically illustrates an absorption coefficient spectrum of the optical device of FIG. 6, according to at least one example embodiment.

FIG. 7 schematically illustrates an example absorption coefficient spectrum of the optical device 100 of FIG. 6. Referring to FIG. 7, when no voltage is applied, a first exciton absorption peak is located at a wavelength of about 926 nm. When an electric field of about 6.0 V/μm is applied, the first exciton absorption peak occurs at a wavelength of about 940 nm. As it is confirmed above, in the simple single quantum well having the same cavity thickness, a voltage of about 8.5 V/μm moves the first exciton absorption peak located at about 926 nm to about 940 nm. Accordingly, the optical device 100 including a three-coupled quantum well according to the example embodiment may rather have a low driving voltage while having improved light absorption intensity, compared to that of the single quantum well structure.

Figure 8:
FIG. 8 illustrates a detailed example of an optical device having a three-coupled quantum well structure that is designed to have a 850 nm resonance wavelength, according to at least one example embodiment.

FIG. 8 illustrates an example of an optical device 200 having a three-coupled quantum well structure that is designed to have a resonance wavelength of about 850 nm. Referring to FIG. 8, an n-contact layer 202 is formed of, or includes, n-InGaP to a thickness of about 100 nm on a GaAs substrate 201. An $Al_{0.31}Ga_{0.69}As$ cladding layer 212 functioning as an outer barrier is formed on the n-contact layer 202 to a thickness of about 50 nm. Sixteen (16) pairs of a first quantum well layer 213a formed of, or includes, $Al_{0.10}Ga_{0.90}As$ to a thickness of about 3 nm, a first coupling barrier 214a formed of, or includes, $Al_{0.20}Ga_{0.80}As$ to a thickness of about 1 nm, a second quantum well layer 213b formed of, or includes, GaAs to a thickness of about 7.9 nm, a second coupling barrier 241b formed of, or includes, $Al_{0.20}Ga_{0.80}As$ to a thickness of about 1 nm, and a third quantum well layer 213c formed of, or includes, $Al_{0.10}Ga_{0.90}As$ to a thickness of about 2 nm are repeatedly stacked on and about the cladding layer 212. $Al_{0.31}Ga_{0.69}As$ is inserted between each of the three-coupled quantum wells as an outer barrier 215 to have a thickness of about 4 nm. An $Al_{0.31}Ga_{0.69}As$ cladding layer 212 functioning as an outer barrier is formed again to a thickness of about 50 nm on the 16$^{th}$ three-coupled quantum well. A p-contact layer 203 is formed of, or includes, p-GaAs to a thickness of about 10 nm on the $Al_{0.31}Ga_{0.69}As$ cladding layer 212. The $Al_{0.31}Ga_{069}As$ cladding layer 212 may be formed to be relatively thick so as to function as both an outer barrier and a diffusion prevention layer to reduce or prevent diffusion of dopants of the n- and p-contact layers 202 and 203 into the first, second, and third quantum well layers 213a, 213b, and 213c. Since light of an 850 nm wavelength does not transmit through GaAs, the GaAs substrate 201 may be partially removed so as to transmit light for the manufacturing of a transmissive optical modulator. In this case, the n-contact layer 202 may function as an etch stop layer.

Figure 9:
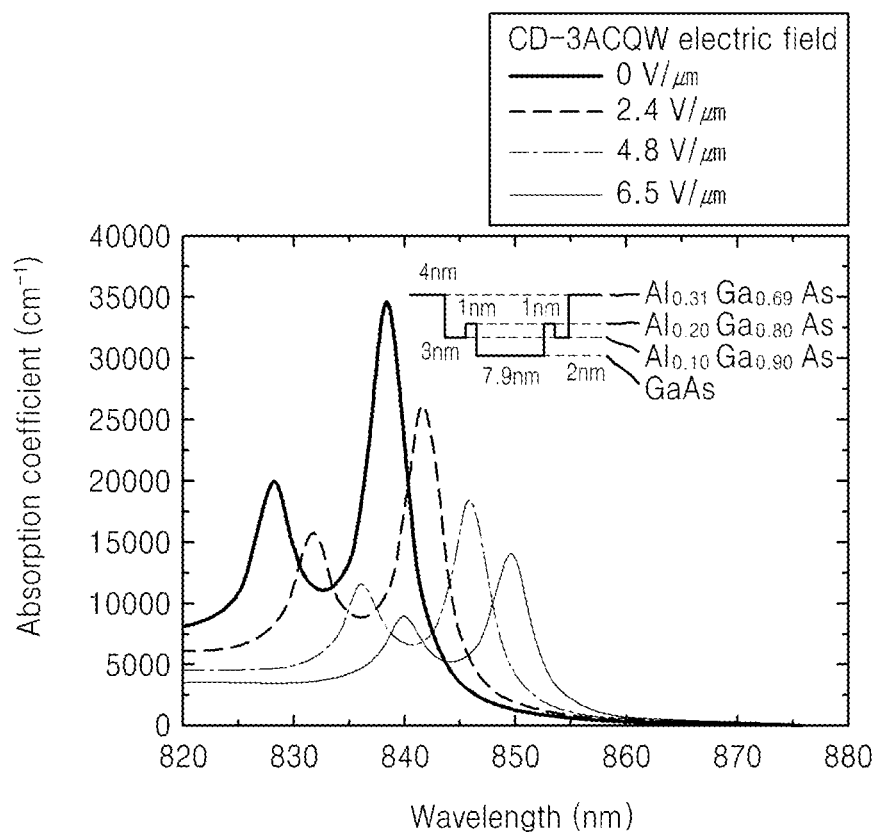
FIG. 9 schematically illustrates an absorption coefficient spectrum of the optical device of FIG. 8, according to at least one example embodiment.

FIG. 9 schematically illustrates an absorption coefficient spectrum of the optical device 200 of FIG. 8. Referring to FIG. 9, when no voltage is applied, a first exciton absorption peak is located at a wavelength of about 838 nm. When an electric field of about 6.5 V/μm is applied, the first exciton absorption peak occurs at a wavelength of about 850 nm. In the simple single quantum well having the same cavity thickness, a voltage of about 8.1 V/μm moves the first exciton absorption peak located at about 838 nm to about 850 nm. Accordingly, the optical device 200 including a three-coupled quantum well according to the example embodiment may have a low driving voltage while having improved light absorption intensity, compared to that of the single quantum well structure.

Accordingly, an optical device including a three-coupled quantum well according to the example embodiment may simultaneously achieve improved light absorption characteristics and a low driving voltage, compared to an optical device including different quantum well structures. The optical device including the three-coupled quantum well structure may be applied not only to an optical modulator but also to a semiconductor device having a variety of PIN diode structures to absorb light of a particular wavelength band. For example, the above-described principle may be applied to an optical filter, a photodiode, a solar cell, a light-emitting device, a light communication system, an optical interconnection, an optical calculator, etc.

Optical modulators having a variety of structures adopting the above-described three-coupled quantum well structure will be described below in detail.

Figure 10:
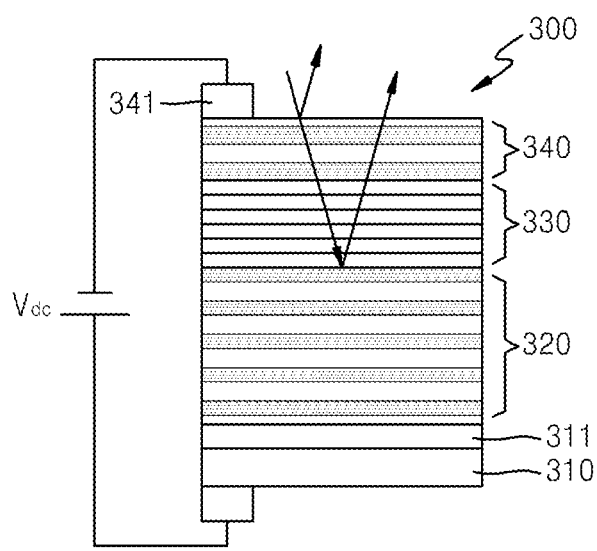
FIG. 10 schematically illustrates a structure of a reflective optical modulator including the three-coupled quantum well structure, according to an example embodiment.

FIG. 10 schematically illustrates a structure of an example reflective optical modulator 300 having a three-coupled quantum well structure. Referring to FIG. 10, the reflective optical modulator 300 may include a substrate 310, a first contact layer 311 on the substrate 310, a lower reflection layer 320 on the first contact layer 311, an active layer 330 on the lower reflection layer 320, an upper reflection layer 340 on the active layer 330, and a second contact layer 341 on the upper reflection layer 340. The upper and lower reflection layers 340 and 320 may be doped to function both as a reflection layer and an electrical path. For example, the first contact layer 311 and the lower reflection layer 320 may be doped with an n-type dopant, whereas the upper reflection layer 340 and the second contact layer 341 may be doped with a p-type dopant. The active layer 330 is undoped. As such, the reflective optical modulator 300 of FIG. 10 has a P-I-N diode structure.

According to at least one example embodiment, the reflective optical modulator 300 reflects incident light and also modulates an intensity of reflected light by absorbing at least part of the incident light according to an electric signal. To reflect the incident light, the lower reflection layer 320 has a reflectivity of about 90% or more and the upper reflection layer 340 may have a reflectivity of about 30%-50%. The lower and upper reflection layers 320 and 340 may each be, for example, a distributed Bragg reflector (DBR) obtained by repeatedly and alternately stacking a low refractive index layer having a relatively low refractive index and a high refractive index layer having a relatively high refractive index. In the above example structure, reflection occurs on an interface between two layers having different refractive indexes, that is, the high refractive index layer and the low refractive index layer. A high reflectivity may be obtained by making phase differences of all reflected lights identical to one another. To this end, an optical thickness, that is, a value obtained by multiplying a physical thickness by a refractive index of a layer material, of each of the high and low refractive index layers in the lower and upper reflection layers 320 and 340 may be an odd-number multiple of about $\lambda/4$, where $\lambda$ is a resonance wavelength of the reflective optical modulator 300. Also, reflectivity may be adjusted as desired according to the number of stacks of pairs of the high and low refractive index layers.

According to at least one example embodiment, the active layer 330 is a layer where light absorption occurs and may have a multiple quantum well layer structure in which the above-described three-coupled quantum well structure and the outer barriers are repeatedly stacked. The active layer 330 may function as a main cavity for Fabry-Perot resonance. To this end, an optical thickness of the active layer 330 may approximately be an integer multiple of $\lambda/2$.

FIG. 11 illustrates an example of the reflective optical modulator 300 of FIG. 10. Referring to FIG. 11, the first contact layer 311 having a thickness of about 500 nm is formed on the substrate 310 formed of, or includes, GaAs. The first contact layer 311 may be formed of, or includes, n-GaAs. The lower reflection layer 320 may include an n-$Al_{0.87}Ga_{0.13}As$ layer having a thickness of about 76.6 nm as a low refractive index layer and an n-$Al_{0.20}Ga_{0.80}As$ layer having a thickness of about 68.6 nm as a high refractive index layer and has a structure in which a pair of the low and high refractive index layers is stacked about 25.5 times. To function as a current path, the lower reflection layer 320 may be doped to a concentration of about $3.18\times10^{18}/cm^3$ by using silicon as a dopant.

The active layer 330 may include an $Al_{0.31}Ga_{0.69}As$ cladding layer having a thickness of about 7.6 nm on the lower reflection layer 320. The active layer 330 may include twenty-nine (29) pairs of three-coupled quantum wells including an outer barrier formed of, or includes, $GaAs_{0.6}P_{0.4}$ to a thickness of about 5.8 nm, a first quantum well layer formed of, or includes, $In_{0.10}Ga_{0.90}As$ to a thickness of about 2.0 nm, a first coupling barrier formed of, or includes, GaAs to a thickness of about 1.5 nm, a second quantum well layer formed of, or includes, $In_{0.15}Ga_{0.85}As$ to a thickness of about 5.0 nm, a second coupling barrier formed of, or includes, GaAs to a thickness of about 1.5 nm, a third quantum well layer formed of, or includes, $In_{0.10}Ga_{0.90}As$ to a thickness of about 2.0 nm, an outer barrier formed of, or includes, $GaAs_{0.6}P_{0.4}$ to a thickness of about 5.8 nm, which are disposed on and about the cladding layer. An $Al_{0.31}Ga_{0.69}As$ cladding layer having a thickness of about 7.6 nm may be formed on the $29^{th}$ three-coupled quantum well. The optical thickness of the active layer 330 is set to be $2\lambda$.

Also, the upper reflection layer 340 on the active layer 330 may include a p-$Al_{0.87}Ga_{0.13}As$ layer having a thickness of 76.6 nm as a low refractive index layer and a p-$Al_{0.20}Ga_{0.80}As$ layer having a thickness of 68.6 nm as a high refractive index layer. The upper reflection layer 340 having a low reflectivity may have, for example, only two (2) pairs of a high refractive index layer and a low refractive index layer. The thickness of the topmost high refractive index layer may be about 58.2 nm for phase matching. To function as a current path, the upper reflection layer 340 may be doped to a concentration of about $4.6\times10^{18}/cm^3$ to about $6.5\times10^{18}/cm^3$ by using beryllium as a dopant. A p-GaAs layer having a thickness of about 10 nm may be formed on the upper reflection layer 340 as the second contact layer 341.

Figure 12:
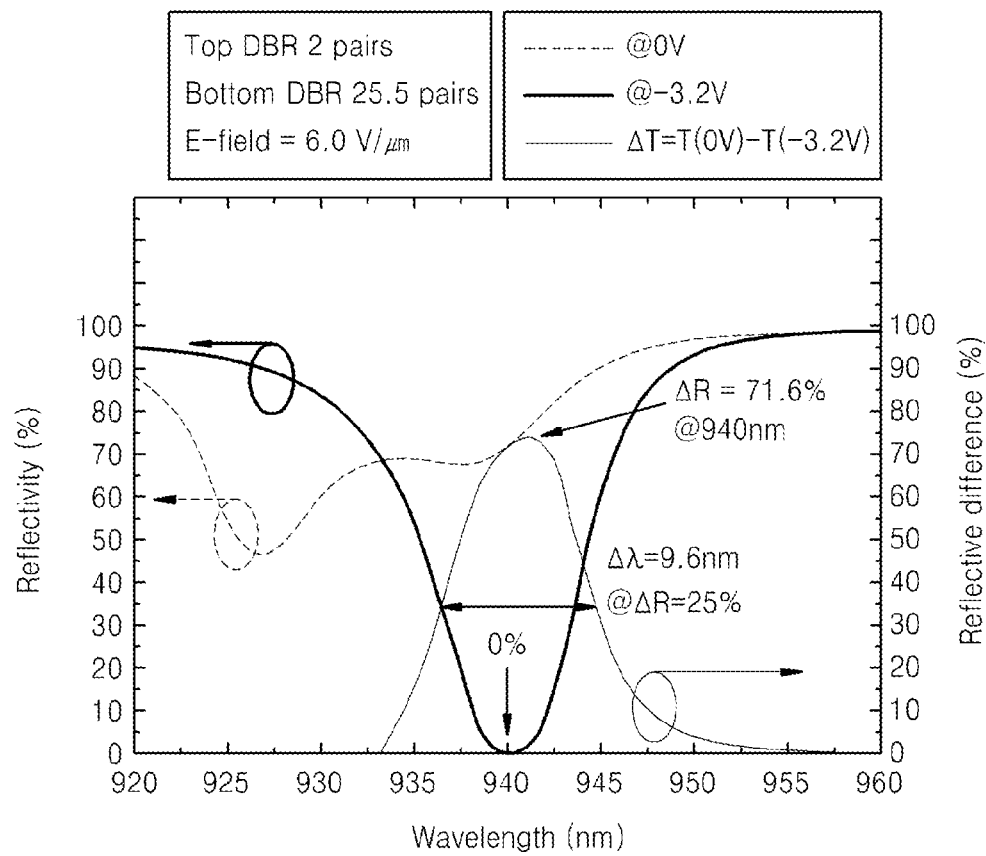
FIG. 12 schematically illustrates a reflection characteristic of the reflective optical modulator of FIG. 11, according to at least one example embodiment.

FIG. 12 schematically illustrates a reflection characteristic of the reflective optical modulator 100 of FIG. 9. In FIG. 12, a curve indicated by a dashed line denotes reflectivity with respect to a left vertical axis when a voltage is not applied. A curve indicated by a thick solid line denotes reflectivity with respect to the left vertical axis when a voltage of about 3.2 V is applied. A curve indicated by a thin solid line denotes a difference in the reflectivity with respect to a right vertical axis between when a voltage is not applied and when a voltage is applied. Referring to FIG. 12, the maximum absorption occurs at a wavelength of about 940 nm at a relatively low voltage of about −3.2 V and a difference in the reflectivity between the minimum reflectivity and the maximum reflectivity at a wavelength of about 940 nm is about 71.6%. In particular, reflectivity is almost 0% when a voltage of about −3.2 V is applied. Accordingly, it may be seen that a contrast ratio of the reflective optical modulator 300 of FIG. 11 is improved. Also, it may be seen that a bandwidth indicating a difference in the reflectivity of about 25% is about 9.6 nm, which is wide.

Figure 13:
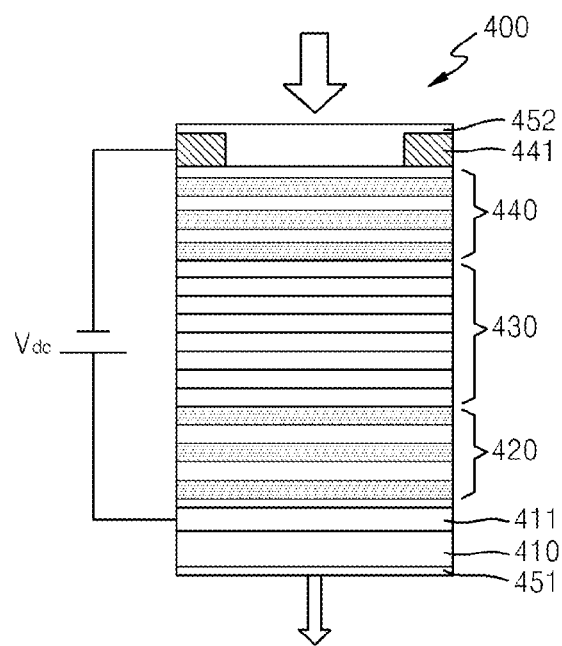
FIG. 13 schematically illustrates a structure of a transmissive optical modulator including the three-coupled quantum well structure, according to an example embodiment.

FIG. 13 schematically illustrates a structure of a transmissive optical modulator 400 having a three-coupled quantum well structure, according to an example embodiment. Referring to FIG. 13, the transmissive optical modulator 400 according to the example embodiment may include a substrate 410, a first contact layer 411 on the substrate 410, a lower reflection layer 420 on the first contact layer 411, an active layer 430 on the lower reflection layer 420, an upper reflection layer 440 on the active layer 430, and a second contact layer 441 on at least a part of an upper surface of the upper reflection layer 440. Also, the transmissive optical modulator 400 may further include an anti-reflection coating 451 on a lower surface of the substrate 410, and a passivation layer 452 on the second contact layer 241. The upper reflection layer 440 and the lower reflection layer 420 may be doped so as to simultaneously function as a reflection layer and an electric path.

As described above, since light having a 940 nm wavelength is transmissive through GaAs, when the transmissive optical modulator 400 is operated with respect to light having a 940 nm wavelength, the substrate 410 does not need to be removed, even though the substrate 410 is formed of, or includes, GaAs.

According to at least one example embodiment, the transmissive optical modulator 400 modulates an intensity of projected light by absorbing at least part of incident light according to an electric signal while transmitting the incident light. The lower reflection layer 420 and the upper reflection layer 440 transmit at least part of the incident light and also reflect light so that resonance may occur in the active layer 430 that is the main cavity. The lower reflection layer 420 and the upper reflection layer 440 may be DBRs in which a lower refractive index layer having a relatively low refractive index and a high refractive index layer having a relatively high refractive index are repeatedly and alternately stacked. A typical transmissive optical modulator from which the substrate 410 is removed may be manufactured such that the structures of the lower reflection layer 420 and the upper reflection layer 440 are symmetrical with each other. However, when the substrate 410 is not removed, the reflectivity of the lower reflection layer 420 may be lowered by the substrate 410 under the lower reflection layer 420. Accordingly, in order to increase the reflectivity of the lower reflection layer 420, the number of pairs of lower refractive index layer/high refractive index layer of the lower reflection layer 420 may be greater than the number of pairs of the lower refractive index layer/high refractive index layer of the upper reflection layer 440. The anti-reflection coating 451 is disposed under the substrate 410 to improve transmittance.

FIG. 14 illustrates an example of the transmissive optical modulator 400 of FIG. 13. Referring to FIG. 14, the anti-reflection coating 451 is formed of, or includes, SiNx to a thickness of about 118.1 nm on a lower surface of the substrate 410. The first contact layer 411 is formed of, or includes, n-GaAs to a thickness of about 500 nm on an upper surface of the substrate 410. The lower reflection layer 420, including eleven (11) pairs of a high refractive index layer that is formed of, or includes, n-$Al_{0.20}Ga_{0.80}As$ to a thickness of about 68.6 nm and a low refractive index layer that is formed of, or includes, n-$Al_{0.87}Ga_{0.13}As$ to a thickness of about 76.6 nm, is disposed on and above the first contact layer 411.

The active layer 430 disposed on the lower reflection layer 420 may include a cladding layer that is formed of, or includes, $Al_{0.31}Ga_{0.69}As$ to a thickness of about 8.3 nm. The active layer 430 may include an outer barrier formed of, or includes, $GaAs_{0.6}P_{0.4}$ to a thickness of about 5.8 nm, a first quantum well layer formed of, or includes, $In_{0.10}Ga_{0.90}As$ to a thickness of about 2.0 nm, a first coupling barrier formed of, or includes, GaAs to a thickness of about 1.5 nm, a second quantum well layer formed of, or includes, $In_{0.15}Ga_{0.85}As$ to a thickness of about 5.0 nm, a second coupling barrier formed of, or includes, GaAs to a thickness of about 1.5 nm, a third quantum well layer formed of, or includes, $In_{0.10}Ga_{0.90}As$ to a thickness of about 2.0 nm, and an outer barrier formed of, or includes, $GaAs_{0.6}P_{0.4}$ to a thickness of about 5.8, which are formed on and above the cladding layer. An $Al_{0.31}Ga_{0.69}As$ cladding layer having a thickness of about 8.3 nm may be formed on the $44^{th}$ three-coupled quantum well. The optical thickness of the active layer 430 is set to be about $3\lambda$.

Also, the upper reflection layer 440 may include six (6) pairs of a high refractive index layer formed of, or includes, p-$Al_{0.20}Ga_{0.80}As$ to a thickness of about 68.6 nm and a low refractive index layer formed of, or includes, p-$Al_{0.87}Ga_{0.13}As$ to a thickness of about 76.6 nm. Also, the topmost high refractive index layer may have a thickness of about 58.2 nm for phase matching. The second contact layer 441 that is formed of, or includes, p-GaAs may be disposed on the upper reflection layer 440. The passivation layer 452 that is formed of, or includes, $SiO_2$ may be disposed on the second contact layer 441.

Figure 15:
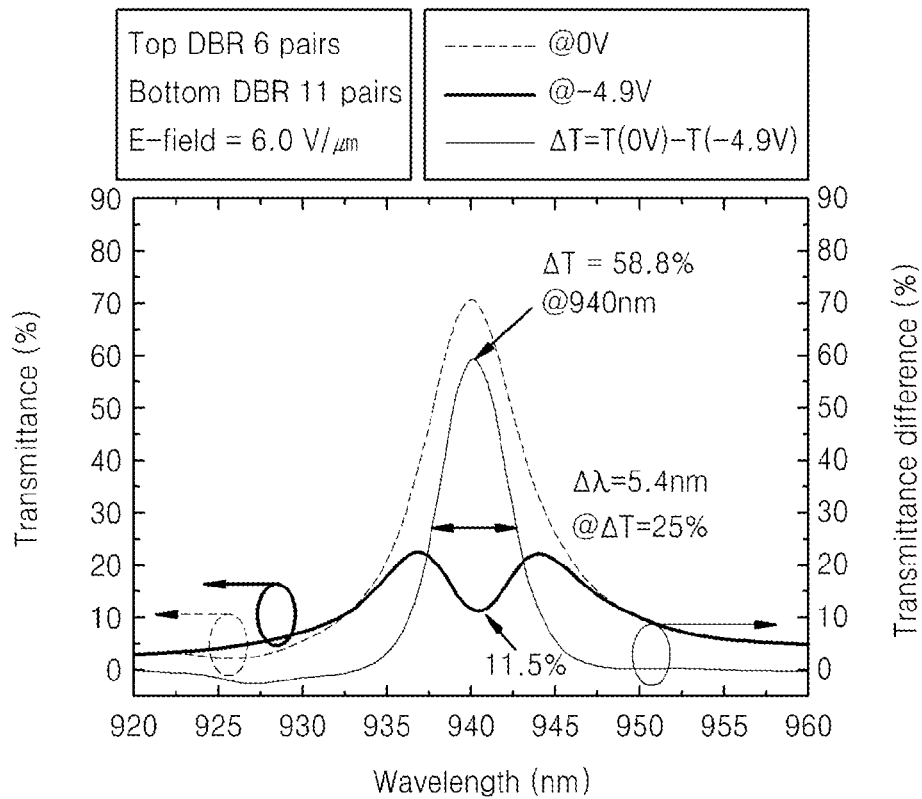
FIG. 15 schematically illustrates a transmittance characteristic of the transmissive optical modulator of FIG. 14, according to at least one example embodiment.

FIG. 15 schematically illustrates a transmittance characteristic of the transmissive optical modulator 400 of FIG. 14, according to at least one example embodiment. In FIG. 15, a curve indicated by a dashed line denotes transmittance with respect to a left vertical axis when a voltage is not applied. A curve indicated by a thick solid line denotes transmittance with respect to the left vertical axis when a voltage of about −4.9 V is applied. A curve indicated by a thin solid line denotes a difference in the transmittance with respect to a right vertical axis between when a voltage is not applied and when a voltage is applied. Referring to FIG. 15, the maximum absorption occurs at a wavelength of about 940 nm at a relatively low voltage of about −4.9 and a difference in the transmittance between the minimum transmittance and the maximum transmittance at a wavelength of about 940 nm is improved to about 58.8%. Also, a bandwidth indicating a transmittance of about 25% is about 5.4 nm. A demodulation contract of the transmissive optical modulator 400, expressed by (Tmax−Tmin)/(Tmax+Tmin), is about 71.9%, which is high.

A general optical modulator has a characteristic that a center transmission wavelength varies according to a change in temperature and variables in a manufacturing process. In order to maintain a modulation characteristic constant in spite of the changes, it may be advantageous to perform modulation uniformly across a wide wavelength band. In other words, it is advantageous that an optical modulator has a wide bandwidth.

Figure 16:
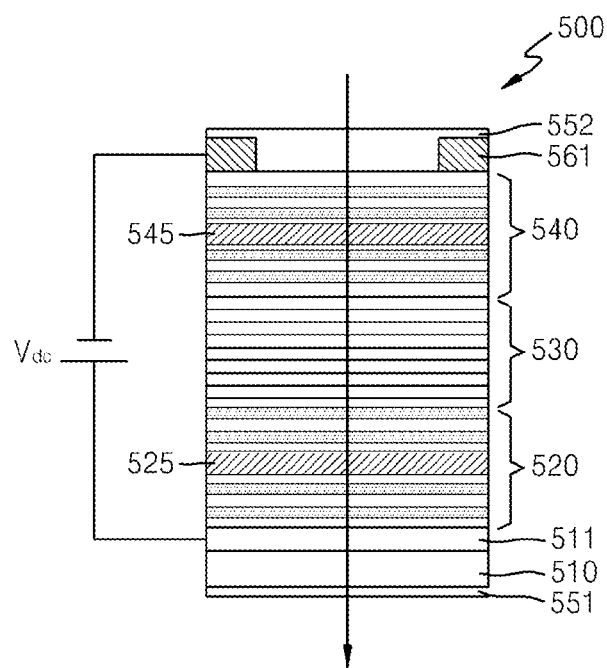
FIG. 16 schematically illustrates a structure of a transmissive optical modulator including the three-coupled quantum well structure, according to another example embodiment.

FIG. 16 schematically illustrates a structure of a transmissive optical modulator 500 having a three-coupled quantum well structure and designed to have a wide bandwidth, according to another example embodiment. Referring to FIG. 16, the transmissive optical modulator 500 may include a substrate 510, a first contact layer 511 disposed on the substrate 510, a lower reflection layer 520 disposed on the first contact layer 511, an active layer 530 disposed on the lower reflection layer 520, an upper reflection layer 540 disposed on the active layer 530, a first microcavity layer 525 disposed in the lower reflection layer 520, a second microcavity layer 545 disposed in the upper reflection layer 540, and a second contact layer 561 at least partially disposed on an upper surface of the upper reflection layer 540. The transmissive optical modulator 500 may further include an anti-reflection coating 551 formed on a lower surface of the substrate 510 and a passivation layer 552 formed on the second contact layer 561. The upper reflection layer 540 and the lower reflection layer 520 may be doped to simultaneously function as a reflection layer and an electric path. Since light having a 940 nm wavelength transmits through GaAs, when the transmissive optical modulator 500 is operated with respect to light having a 940 nm wavelength, the substrate 510 does not need to be removed, even though the substrate 510 is formed of, or includes, GaAs.

The active layer 530 is a main cavity for Fabry-Perot resonance, and the first and second microcavity layers 525 and 545 function as an additional cavity for Fabry-Perot resonance. To this end, an optical thickness of each of the first and second microcavity layers 525 and 545 may approximately be an integer multiple of $\lambda/2$. The first and second microcavity layers 525 and 545 may be each formed of, or includes, a high refractive index layer material or a low refractive index layer material of the lower and upper reflection layers 520 and 540. Both of the first and second microcavity layers 525 and 545 may be disposed in either the lower reflection layer 520 or the upper reflection layer 540. Any one of the first and second microcavity layers 525 and 545 may be omitted.

Although it is not explicitly illustrated in FIG. 16, it is possible to make the thicknesses of quantum well layers in the active layer 530 to be different from one another in order to increase a bandwidth. For example, two or more types of second quantum well layers having different thicknesses may be formed by changing the thickness of a second quantum well layer where electron's and hole's wave functions are superimposed. An absorption mode increases through the addition of the first and second microcavity layers 525 and 545 and the change of the thickness of the quantum well layer and thus a light absorption bandwidth of the transmissive optical modulator 500 may be improved.

FIG. 17 illustrates an example of the transmissive optical modulator 500 of FIG. 16, according to at least one example embodiment. Referring to FIG. 17, an anti-reflection coating 551 is formed of, or includes, SiNx to a thickness of about 118.1 nm on a lower surface of the substrate 510. A first contact layer 511 is formed of, or includes, n-GaAs to a thickness of about 500 nm on an upper surface of the substrate 510.

The lower reflection layer 520, including a plurality of high refractive index layers, each being formed of, or includes, n-$Al_{0.20}Ga_{0.80}As$ and having a thickness of about 68.6 nm, and a plurality of low refractive index layers, each formed of, or includes, n-$Al_{0.87}Ga_{0.13}As$ and having a thickness of about 76.6 nm, which are formed on the first contact layer 511. The first microcavity layer 525 is formed of, or includes, n-$Al_{0.20}Ga_{0.80}As$ to a thickness of about 137.2 nm in the lower reflection layer 520. The first microcavity layer 525 may split the lower reflection layer 520 into a first lower reflection layer 521 and a second lower reflection layer 522. The first lower reflection layer 521 disposed under the first microcavity layer 525 may include eight (8) pairs of a high refractive index layer and a low refractive index layer. The second lower reflection layer 522 disposed above the first microcavity layer 525 may include fourteen (14) pairs of a high refractive index layer and a low refractive index layer. Also, a phase matching layer 526 may be further provided between the first microcavity layer 525 and the second lower reflection layer 522. The phase matching layer 526 is inserted such that the higher refractive index layer and the low refractive index layer are alternately disposed in the entire structure of the lower reflection layer 520 including the first microcavity layer 525. For example, when the first microcavity layer 525 is formed of, or includes, a high refractive index layer material, the phase matching layer 526 may be formed of, or includes, a low refractive index layer material. When the first microcavity layer 525 is formed of, or includes, a low refractive index layer material, the phase matching layer 526 may be formed of, or includes, a high refractive index layer material. In the example of FIG. 17, the first microcavity layer 525 may be formed of, or includes, a high refractive index layer material and has an optical thickness of $\lambda/2$.

According to at least one example embodiment, the upper reflection layer 540 includes a plurality of high refractive index layers, each being formed of, or includes, p-$Al_{0.20}Ga_{0.80}As$ and having a thickness of about 68.6 nm, and a plurality of low refractive index layers, each being formed of, or includes, p-$Al_{0.87}Ga_{0.13}As$ and having a thickness of about 76.6 nm. The second microcavity layer 545 is formed of, or includes, p-$Al_{0.20}Ga_{0.80}As$ to a thickness of about 137.2 nm in the upper reflection layer 540. The second microcavity layer 545 may split the upper reflection layer 540 into a first upper reflection layer 541 and a second upper reflection layer 542. The first upper reflection layer 541 disposed under the second microcavity layer 545 may include, for example, fourteen (14) pairs of a high refractive index layer and a low refractive index layer. The second upper reflection layer 542 disposed above the second microcavity layer 545 may include four (4) pairs of a high refractive index layer and a low refractive index layer. The topmost high refractive index layer may be thinner other high refractive index layers for phase matching. Also, a phase matching layer 546 may be further provided between the second microcavity layer 545 and the first upper reflection layer 541. The phase matching layer 546 is inserted such that the higher refractive index layer and the low refractive index layer are alternately disposed in the entire structure of the upper reflection layer 540 including the second microcavity layer 545. In the example of FIG. 17, the second microcavity layer 545 is formed of, or includes, a high refractive index layer material and has an optical thickness of $\lambda/2$. The second contact layer 561 formed of, or includes, p-GaAs may be disposed on the upper reflection layer 540. The passivation layer 552 formed of, or includes, $SiO_2$ may be disposed on the second contact layer 561.

As illustrated in FIG. 17, the active layer 530 may include lower and upper cladding layers formed of, or includes, $Al_{0.31}Ga_{0.69}As$ to a thickness of about 8.2 nm and two types of three-coupled quantum well structures disposed between the lower and upper cladding layers. The two types of three-coupled quantum well structures may both include a plurality of three-coupled quantum wells having a first quantum well layer/a first coupling barrier/a second quantum well layer/a second coupling barrier/a third quantum well layer. An outer barrier may be interposed between the three-coupled quantum wells. The materials and thicknesses of the first quantum well layer, the first coupling barrier, the second coupling barrier, the third quantum well layer, and the outer barrier may be the same as those of the above-described example embodiments.

However, the thickness of the second quantum well layer may differ in the two types of three-coupled quantum well structures. For example, while the second quantum well layer in a first three-coupled quantum well structure may be formed of, or includes, $In_{0.15}Ga_{0.85}As$ having a thickness of about 4.5 nm, the second quantum well layer in a second three-coupled quantum well structure may be formed of, or includes, $In_{0.15}Ga_{0.85}As$ having a thickness of about 5.0 nm. The first three-coupled quantum well structure may include a total of fifty-four (54) pairs of three-coupled quantum wells, and the second three-coupled quantum well structure may include a total of fifty-three (53) pairs of three-coupled quantum wells. Also, although FIG. 15 shows that the first three-coupled quantum well structure is first formed, and the second three-coupled quantum well structure may be formed on the first three-coupled quantum well structure, three-coupled quantum wells of the first three-coupled quantum well structure and three-coupled quantum wells of the second three-coupled quantum well structure may be arranged by being mixed up with each other, or by being alternatively or substantially alternatively disposed. As such, when the two different types of second quantum well layers having thicknesses different from each other are used, two absorption modes are formed in the active layer 530 so that a light absorption bandwidth may be improved. The overall optical thickness of the active layer 530 may be set to, for example, 7λ.

Figure 18:
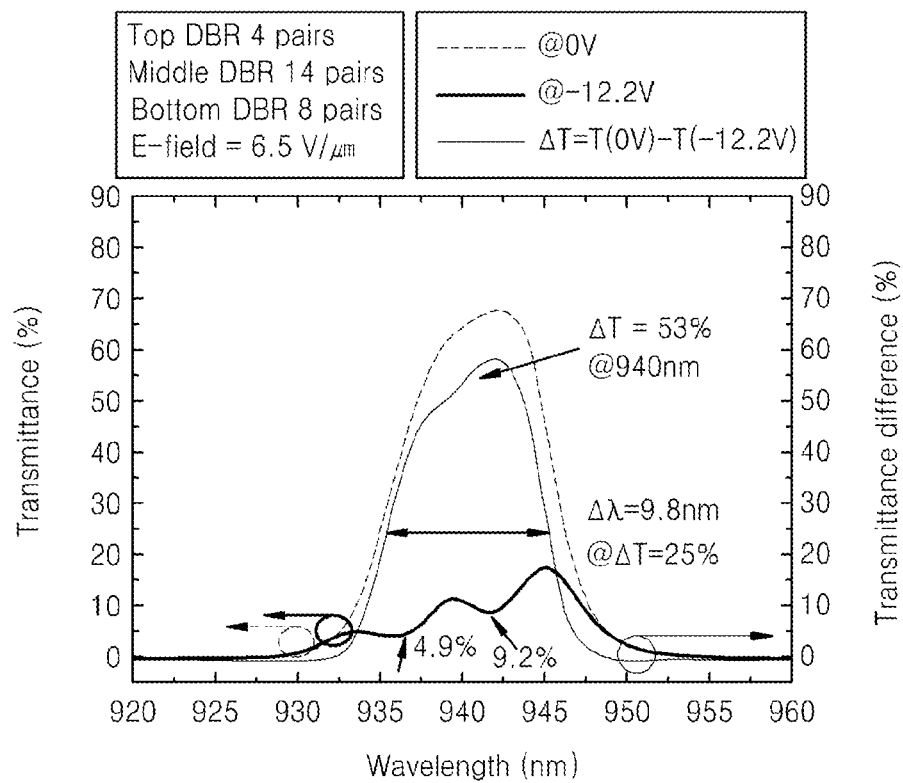
FIG. 18 schematically illustrates a transmittance characteristic of the transmissive optical modulator of FIG. 17, according to at least one example embodiment.

FIG. 18 schematically illustrates a transmittance characteristic of the transmissive optical modulator 500 of FIG. 17, according to at least one example embodiment. In FIG. 18, a curve indicated by a dashed line denotes transmittance with respect to a left vertical axis when a voltage is not applied. A curve indicated by a thick solid line denotes transmittance with respect to the left vertical axis when a voltage of about −12.2 V is applied. A curve indicated by a thin solid line denotes a difference in the transmittance with respect to a right vertical axis between when a voltage is applied and when a voltage is not applied. As illustrated in the graph of FIG. 18, a transmittance difference of about 53% may be obtained at a wavelength of about 940 nm at a driving voltage of about −12.2 V and it may be seen that a bandwidth in which the transmittance difference is 25% or more is improved to about 9.8 nm. Also, the demodulation contrast of the transmissive optical modulator 500 may be about 69.9%.

In the example of FIG. 17, the first and second microcavity layers 525 and 545, each being a single layer, are respectively disposed in the lower and upper reflection layers 520 and 540, and two types of three-coupled quantum well structures are disposed in the active layer 530. However, two or more microcavities may be further disposed in the lower reflection layer 520 or the upper reflection layer 540. Also, the active layer 530 may include a combination of one type of a three-coupled quantum well structure and one type of a single quantum well structure. The structure of the first and second microcavity layers 525 and 545 and the active layer 530 of FIG. 17 may be applied to the reflective optical modulator 300 of FIG. 10.

Figure 19:
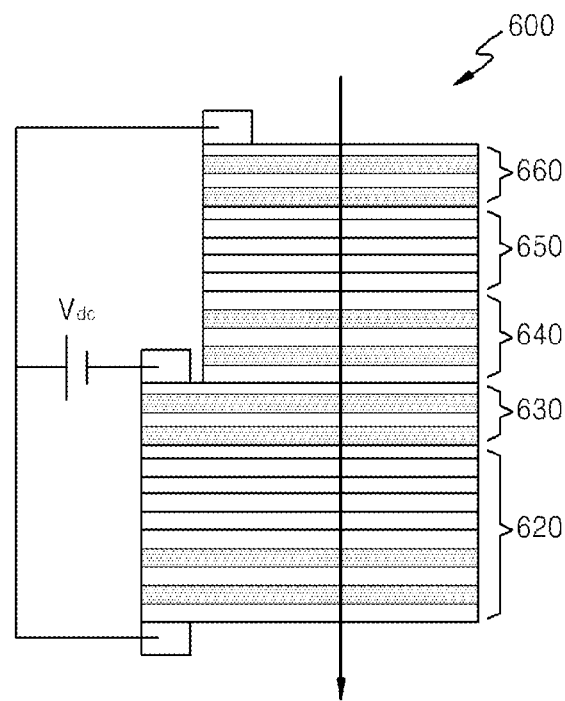
FIG. 19 schematically illustrates a structure of a transmissive optical modulator including the three-coupled quantum well structure, according to another example embodiment.

FIG. 19 schematically illustrates a structure of a transmissive optical modulator 600 having a three-coupled quantum well structure, according to another example embodiment. Referring to FIG. 19, the transmissive optical modulator 600 may include a lower reflection layer 620, a first active layer 630 on the lower reflection layer 620, an intermediate reflection layer 640 on the first active layer 630, a second active layer 650 on the intermediate reflection layer 640, and an upper reflection layer 660 on the second active layer 650. The lower and upper reflection layers 620 and 660 may be doped with a dopant of the same electrical type, whereas the intermediate reflection layer 640 may be doped with a dopant of an electrical type that is opposite to the dopant type of the lower and upper reflection layers 620 and 660. For example, the lower and upper reflection layers 620 and 660 may be doped with an n-type dopant, whereas the intermediate reflection layer 640 may be doped with a p-type dopant. Alternatively, the lower and upper reflection layers 620 and 660 may be doped with a p-type dopant, whereas the intermediate reflection layer 640 may be doped with an n-type dopant. Accordingly, the transmissive optical modulator 600 of FIG. 19 may have an N-I-P-I-N or P-I-N-I-P structure.

The transmissive optical modulator 600 may have a stack-type diode structure in which two diodes are stacked and electrically connected in parallel. In general, a driving voltage of an optical modulator is proportional to the total thickness of the active layer, or the total number of quantum well layers in the active layer. However, in the transmissive optical modulator 600 according to an example embodiment, since the two active layers, namely, the first and second active layers 630 and 650, are electrically connected to each other in parallel, the driving voltage may be reduced approximately by half, compared to an optical modulator having one active layer having a thickness equivalent to a sum of the thicknesses of the two active layers, namely, the first and second active layers 630 and 650. Accordingly, power consumption may be additionally reduced so that the deterioration in the performance of the transmissive optical modulator 600 due to heat may be reduced.

Also, according to at least one example embodiment, a bandwidth of the transmissive optical modulator 600 may be increased by forming the three-coupled quantum well structure of the first active layer 630 and the three-coupled quantum well structure of the second active layer 650 differently. In other words, absorption modes are increased through a multi-resonance mode in which a resonance wavelength of the first active layer 630 and a resonance wavelength of the second active layer 650 are different, and the light absorption bandwidth of the transmissive optical modulator 600 may be increased. For example, the thickness of the second quantum well layer in the three-coupled quantum well structure of the first active layer 630 and the thickness of the second quantum well layer in the three-coupled quantum well structure of the second active layer 650 may be selected to be different. Also, the first active layer 630 may include two or more types of three-coupled quantum well structures, and the second active layer 650 may include two or more types of three-coupled quantum well structures.

FIG. 20 illustrates a detailed example of the transmissive optical modulator 600 of FIG. 19. Referring to FIG. 20, an anti-reflection coating 671 is formed of, or includes, SiNx to a thickness of about 118.1 nm on a lower surface of a substrate 610. A first contact layer 611 is formed of, or includes n-GaAs to a thickness of about 500 nm on an upper surface of the GaAs substrate 610. The lower reflection layer 620, including six (6) pairs of a high refractive index layer that is formed of, or includes n-$Al_{0.20}Ga_{0.80}As$ to a thickness of about 68.6 nm and a low refractive index layer that is formed of, or includes, n-$Al_{0.87}Ga_{0.13}As$ to a thickness of about 76.6 nm, is on the first contact layer 611. The lower reflection layer 620 is doped with an n-type dopant.

The first active layer 630 formed on the lower reflection layer 620 may include lower and upper cladding layers formed of, or includes, $Al_{0.31}Ga_{0.69}As$ to a thickness of about 9.7 nm and two types of three-coupled quantum well structures disposed between the lower and upper cladding layers. The two types of three-coupled quantum well structures may both include a plurality of three-coupled quantum wells having a first quantum well layer/a first coupling barrier/a second quantum well layer/a second coupling barrier/a third quantum well layer. An outer barrier may be interposed between the three-coupled quantum wells. The materials and thicknesses of the first quantum well layer, the first coupling barrier, the second coupling barrier, the third quantum well layer, and the outer barrier may be the same as those of the above-described example embodiments.

However, the thickness of the second quantum well layer may differ in the two types of three-coupled quantum well structures. For example, while the second quantum well layer in a first three-coupled quantum well structure may be formed of, or includes, $In_{0.15}Ga_{0.85}As$ having a thickness of about 4.5 nm, the second quantum well layer in a second three-coupled quantum well structure may be formed of, or includes, $In_{0.15}Ga_{0.85}As$ having a thickness of about 5.0 nm. The first three-coupled quantum well structure may include a total of twenty-three (23) pairs of three-coupled quantum wells, and the second three-coupled quantum well structure may include a total of twenty-two (22) pairs of three-coupled quantum wells. The overall optical thickness of the active layer 630 is set to, for example, 3λ.

According to at least one example embodiment, the intermediate reflection layer 640 disposed on the first active layer 630 may be doped with a p-type dopant. A second contact layer 641 formed of, or includes, p-GaAs to a thickness of about 30 nm may be disposed in the intermediate reflection layer 640. The intermediate reflection layer 640 includes a first intermediate reflection layer 642 disposed under the second contact layer 641 and a second intermediate reflection layer 643 disposed above the second contact layer 641. Each of the first and second intermediate reflection layers 642 and 643 may include five (5) pairs of a high refractive index layer that is formed of, or includes p-$Al_{0.20}Ga_{0.80}As$ to a thickness of about 68.6 nm and a low refractive index layer that is formed of, or includes, p-$Al_{0.87}Ga_{0.13}As$ to a thickness of about 76.6 nm. Also, a phase matching layer 644 that is formed of, or includes a low refractive index layer material may be further disposed between the first intermediate reflection layer 642 and the first active layer 630. Another phase matching layer 645 that is formed of, or includes a high refractive index layer material may be further disposed between the first intermediate reflection layer 642 and the second contact layer 641. Another phase matching layer 646 that is formed of, or includes a low refractive index layer material may be further disposed between the second contact layer 641 and the second intermediate reflection layer 643.

The structure of the second active layer 650 that is disposed on the intermediate reflection layer 640 may be the same as the structure of the first active layer 630. In other words, the second active layer 650 may include lower and upper cladding layers formed of, or includes, $Al_{0.31}Ga_{0.69}As$ to a thickness of about 9.7 nm and two types of three-coupled quantum well structures disposed between the lower and upper cladding layers. The two types of three-coupled quantum well structures may include twenty-three (23) pairs of three-coupled quantum wells, each having a second quantum well layer formed of, or includes, $In_{0.15}Ga_{0.85}As$ to a thickness of about 4.5 nm, and twenty-two (22) pairs of three-coupled quantum wells, each having a second quantum well layer formed of, or includes, $In_{0.15}Ga_{0.85}As$ to a thickness of about 5.0 nm. The overall optical thickness of the second active layer 650 is set to, for example, 3A.

According to at least one example embodiment, the upper reflection layer 660 is disposed on an upper surface of the second active layer 650. The upper reflection layer 660 is doped with an n-type dopant, as in the lower reflection layer 620. The upper reflection layer 660 may include two (2) pairs of a low refractive index layer that is formed of, or includes, n-$Al_{0.87}Ga_{0.13}As$ to a thickness of about 76.6 nm and a high refractive index layer that is formed of, or includes, n-$Al_{0.20}Ga_{0.80}As$ to a thickness of about 68.6 nm. The thickness of the topmost high refractive index layer may be about 58.2 nm for phase matching. A third contact layer 661 may be formed of, or includes, n-GaAs on the upper reflection layer 660. A passivation layer 672 may be formed of, or includes, $SiO_2$ on the third contact layer 661.

Figure 21:
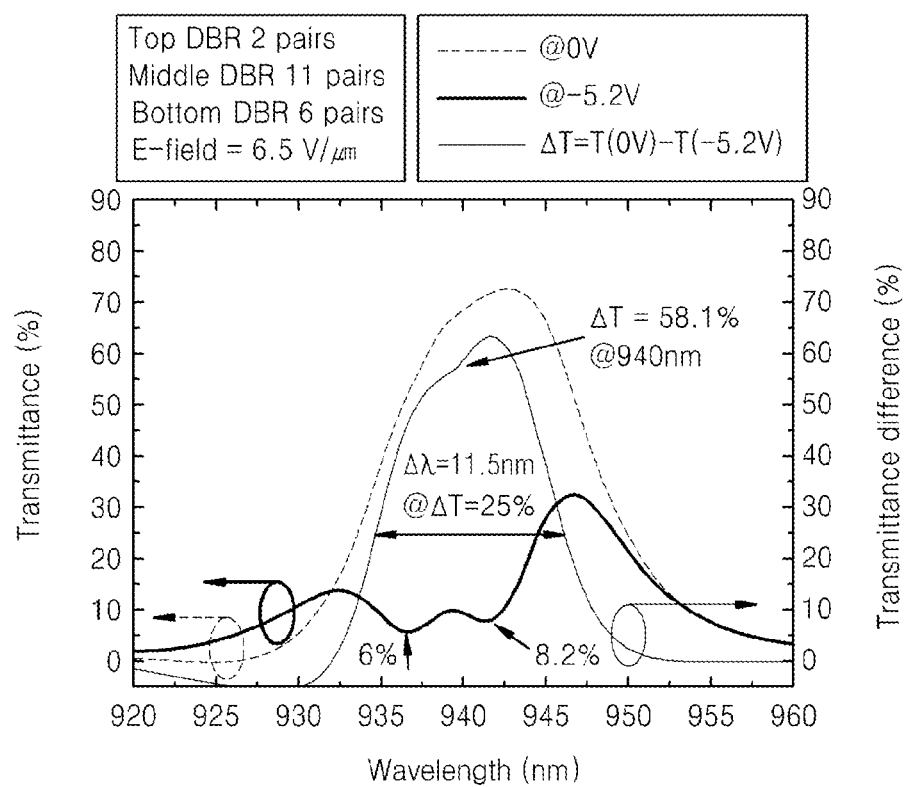
FIG. 21 schematically illustrates a transmittance characteristic of the transmissive optical modulator of FIG. 20, according to at least one example embodiment.

FIG. 21 schematically illustrates a transmittance characteristic of the transmissive optical modulator 600 of FIG. 20. In FIG. 21, a curve indicated by a dashed line denotes transmittance with respect to a left vertical axis when a voltage is not applied. A curve indicated by a thick solid line denotes transmittance with respect to the left vertical axis when a voltage of about −5.2 V is applied. A curve indicated by a thin solid line denotes a difference in the transmittance with respect to a right vertical axis between when a voltage is applied and when a voltage is not applied. As illustrated in the graph of FIG. 21, it may be seen that the driving voltage of the transmissive optical modulator 600 of FIG. 20 is decreased to about −5.2 V, compared to the driving voltage of about −12.2 V of the transmissive optical modulator 500 of FIG. 17. Also, in the transmissive optical modulator 600 of FIG. 20, a transmittance difference of about 58.1% may be obtained with respect to a wavelength of about 940 nm at a driving voltage of about −5.2 V and a bandwidth in which the transmittance difference is 25% or more is improved to about 11.5 nm. Also, the demodulation contrast of the transmissive optical modulator 600 may be about 74.8%.

It should be understood that the example embodiments described herein should be considered in a descriptive sense only and not for purposes of limitation. Descriptions of features within each example embodiment should typically be considered as available for other similar or same features in other example embodiments.

While one or more example embodiments have been described with reference to the figures, it will be understood by those of ordinary skill in the art that various changes in form and details may be made therein without departing from the spirit and scope of the following claims.

What is claimed is:
1. An optical device comprising:
a lower reflection layer doped with a first conductive-type dopant;
an active layer on the lower reflection layer and including a first outer barrier, a second outer barrier, and a first coupled quantum well between the first outer barrier and the second outer barrier; and
an upper reflection layer on the active layer and doped with a second conductive-type dopant that is electrically opposite to the first conductive-type dopant,
wherein the first coupled quantum well includes a first quantum well layer, a second quantum well layer, a third quantum well layer, a first coupling barrier between the first quantum well layer and the second quantum well layer, and a second coupling barrier between the second quantum well layer and the third quantum well layer,
thicknesses of the first quantum well layer and the third quantum well layer are less than a thickness of the second quantum well layer between the first quantum well layer and the third quantum well layer, and
band gaps of the first quantum well layer and the third quantum well layer are larger than a band gap of the second quantum well layer.

2. The optical device of claim 1, wherein band gaps of the first and second coupling barriers are smaller than band gaps of the first and second outer barriers.

3. The optical device of claim 1, wherein thicknesses of the first and second coupling barriers are equal to or less than thicknesses of the first and third quantum well layers.

4. The optical device of claim 1, wherein, in a wavelength of about 850 nm, the first and third quantum well layers comprise $Al_zGa_{1-z}As$ where $0<z<1$, the second quantum well layer comprises GaAs, the first and second coupling barriers comprise $Al_yGa_{1-y}As$ where $z<y<1$, and the first and second outer barriers comprise $Al_xGa_{1-x}As$ where $z<y<x\leq1$.

5. The optical device of claim 1, further comprising a substrate, wherein, in a wavelength range of about 900 nm to about 1050 nm, the first to third quantum well layers include a material having compressive strain with respect to the substrate, and the first and second outer barriers are formed of a material having tensile strain with respect to the substrate.

6. The optical device of claim 5, wherein the first to third quantum well layers comprise $In_xGa_{1-x}As$ where $0.1\leq x\leq0.2$, the first and second coupling barriers comprise GaAs, and the first and second outer barriers comprise $GaAs_{1-y}P_y$ or $In_yGa_{1-y}P$ where $0.4\leq y\leq0.5$.

7. The optical device of claim 1, wherein the first to third quantum well layers comprise at least one of $In_{1-x}Ga_xAs$ and $In_{1-x-y}Ga_xAl_yAs$, the first and second coupling barriers comprise at least one of $In_{1-x'-y'}Ga_{x'}Al_{y'}As$ where $x'<x$ and $y<y'$ and $In_{1-x}Ga_xAs_zP_{1-z}$ where $x'<x$, and the first and second outer barriers comprise at least one of $In_{1-x''-y''}Ga_{x''}Al_{y''}As$ where $x''<x'<x$ and $y<y'<y''$ and $In_{1-x}Ga_{x''}As_{z'}P_{1-z'}$ where $x''<x'<x$, and $z<z'$, and $0<x$, $z<1$.

8. The optical device of claim 1, further comprising at least one microcavity layer in at least one of the lower and upper reflection layers, wherein, when a resonance wavelength of the optical device is $\lambda$, the active layer and the at least one microcavity have an optical thickness that is an integer multiple of $\lambda/2$.

9. The optical device of claim 1, wherein the active layer further includes a third outer barrier, a fourth outer barrier, and a second coupled quantum well between the third outer barrier and the fourth outer barrier,
    the second coupled quantum well comprises a fourth quantum well layer, a third coupling barrier, a fifth quantum well layer, a fourth coupling barrier, and a sixth quantum well layer, and
    a thickness of the second quantum well layer of the first coupled quantum well is different from a thickness of the fifth quantum well layer of the second coupled quantum well.

10. The optical device of claim 9, wherein band gaps of the first to fourth coupling barriers are smaller than band gaps of the first to fourth outer barriers.

11. The optical device of claim 9, wherein a thickness of the fifth quantum well layer is greater than a thickness of the fourth quantum well layer and of the sixth quantum well layer.

12. The optical device of claim 9, wherein a band gap of the fifth quantum well layer is smaller than a band gap of the fourth quantum well layer and of the sixth quantum well layer.

13. The optical device of claim 9, wherein thicknesses of the first and third quantum well layers of the first coupled quantum well are respectively the same as thicknesses of the fourth and sixth quantum well layers of the second coupled quantum well.

14. The optical device of claim 1, wherein a reflectance of the lower reflection layer is higher than a reflectance of the upper reflection layer.

15. The optical device of claim 1, further comprising an anti-reflection coating disposed under the lower reflection layer.

16. An optical device comprising:
    a lower reflection layer doped with a first conductive-type dopant;
    a first active layer on the lower reflection layer;
    an intermediate reflection layer on the first active layer and doped with a second conductive-type dopant that is electrically opposite to the first conductive-type dopant;
    a second active layer on the intermediate reflection layer; and
    an upper reflection layer on the second active layer and doped with the first conductive-type dopant,
    wherein at least one of the first and second active layers comprises a first outer barrier, a second outer barrier, and a first coupled quantum well inserted between the first outer barrier and the second outer barrier,
    the first coupled quantum well comprises a first quantum well layer, a second quantum well layer, a third quantum well layer, a first coupling barrier between the first quantum well layer and the second quantum well layer, and a second coupling barrier between the second quantum well layer and the third quantum well layer,
    thicknesses of the first quantum well layer and the third quantum well layer are less than a thickness of the second quantum well layer between the first quantum well layer and the second quantum well layer, and
    band gaps of the first quantum well layer and the third quantum well layer are larger than a band gap of the second quantum well layer.

17. The optical device of claim 16, wherein band gaps of the first and second coupling barriers are smaller than band gaps of the first and second outer barriers.

18. The optical device of claim 16, wherein at least one of the first and second active layers further comprises a third outer barrier, a fourth outer barrier, and a second coupled quantum well inserted between the third outer barrier and the fourth outer barrier, and
    the second coupled quantum well includes a fourth quantum well layer, a third coupling barrier, a fifth quantum well layer, a fourth coupling barrier, and a sixth quantum well layer, and
    a thickness of the second quantum well layer of the first coupled quantum well is different from a thickness of the fifth quantum well layer of the second coupled quantum well.

19. The optical device of claim 18, wherein a thickness of the fifth quantum well layer is greater than a thickness of the fourth quantum well layer and of the sixth quantum well layer, and
    a band gap of the fifth quantum well layer is smaller than a band gap of the fourth quantum well layer and an energy level of the sixth quantum well layer.

20. An optical device, comprising:
    a first reflection layer;
    a first active layer on the first reflection layer, the first active layer including a first outer barrier, a second outer barrier, and a coupled quantum well between the first outer barrier and the second outer barrier; and
    a second reflection layer on the first active layer;
    the coupled quantum well including a first quantum well layer, a second quantum well layer, a third quantum well layer, a first coupling barrier between the first quantum well layer and the second quantum well layer, and a second coupling barrier between the second quantum well layer and the third quantum well layer,
    thicknesses of the first quantum well layer and the third quantum well layer being smaller than a thickness of the second quantum well layer between the first quantum well layer and the second quantum well layer, and band gaps of the first quantum well layer and the third quantum well layer being larger than a band gap of the second quantum well layer.

21. The optical device of claim 20, further comprising an intermediate reflection layer between the first and second reflection layers, wherein:
the first reflection layer and the second reflection layer are doped with a dopant of a same type; and
the intermediate reflection layer is doped with a dopant of a different type than the first and second reflection layers.

22. The optical device of claim 21, further comprising a second active layer on the intermediate reflection layer;
wherein the second active layer includes a third outer barrier, a fourth outer barrier, and a second coupled quantum well between the third outer barrier and the fourth outer barrier, the second coupled quantum well including a fourth quantum well layer, a third coupling barrier, a fifth quantum well layer, a fourth coupling barrier, and a sixth quantum well layer.

23. The optical device of claim 22, wherein:
thicknesses of the fourth quantum well layer and the sixth quantum well layer are smaller than a thickness of the fifth quantum well layer between the fourth quantum well layer and the sixth quantum well layer, and
band gaps of the fourth quantum well layer and the sixth quantum well layer are larger than a band gap of the fourth quantum well layer.

* * * * *